US007750560B2

United States Patent
Yamazaki et al.

(10) Patent No.: US 7,750,560 B2
(45) Date of Patent: Jul. 6, 2010

(54) LIGHT-EMITTING-ELEMENT

(75) Inventors: Shunpei Yamazaki, Setagaya (JP);
Hisao Ikeda, Atsugi (JP); Satoshi Seo,
Kawasaki (JP); Daisuke Kumaki,
Tokamachi (JP); Junichiro Sakata,
Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 994 days.

(21) Appl. No.: 10/577,472

(22) PCT Filed: Sep. 26, 2005

(86) PCT No.: PCT/JP2005/018225

§ 371 (c)(1),
(2), (4) Date: Apr. 27, 2006

(87) PCT Pub. No.: WO2006/038573

PCT Pub. Date: Apr. 13, 2006

(65) Prior Publication Data

US 2008/0252199 A1    Oct. 16, 2008

(30) Foreign Application Priority Data

Oct. 1, 2004  (JP) ............................. 2004-290678

(51) Int. Cl.
  *H01J 1/62* (2006.01)
  *H01J 63/04* (2006.01)
(52) U.S. Cl. ....................... 313/506; 313/504
(58) Field of Classification Search ...................... None
See application file for complete search history.

(56) References Cited

U.S. PATENT DOCUMENTS

| 6,013,384 A | 1/2000 | Kido et al. |
| 2005/0123751 A1* | 6/2005 | Tsutsui et al. ............... 428/364 |
| 2005/0170208 A1 | 8/2005 | Yatsunami et al. |

FOREIGN PATENT DOCUMENTS

EP    0 855 848    7/1998

(Continued)

OTHER PUBLICATIONS

Organic EL device using SrOx as an electron injection material Kuniaki Tanaka, Kenji Maeda, Hiroaki Usui; Electronics and Communications in Japan (Part II: Electronics), v86, n7, p. 73-20, 2003, DOI: 10.1002/ecjb.1126, http://dx.doi.org/10.1002/ecjb.1126.*

(Continued)

*Primary Examiner*—Toan Ton
*Assistant Examiner*—Britt D Hanley
(74) *Attorney, Agent, or Firm*—Eric J. Robinson; Robinson Intellectual Property Law Office, P.C.

(57) ABSTRACT

The present invention provides a light-emitting element sandwiching a composite layer in which an organic compound and an inorganic compound are mixed between a first electrode and a second electrode, where the composite layer includes a first layer including a first organic compound and a first inorganic compound that exhibits an electron accepting property to the first organic compound (serves as an electron acceptor), a second layer including a second organic compound and a second inorganic compound, and a third layer including a third organic compound and a third inorganic compound that exhibits an electron donating property to the third organic compound (serves as an electron acceptor).

40 Claims, 11 Drawing Sheets

FOREIGN PATENT DOCUMENTS

| | | |
|---|---|---|
| JP | 02-288092 | 11/1990 |
| JP | 10-270172 | 10/1998 |
| JP | 2000-306669 | 11/2000 |
| JP | 2000-315581 | 11/2000 |
| JP | 2005-203340 | 7/2005 |
| JP | 2005-209643 | 8/2005 |
| WO | WO 2005/064995 | 7/2005 |

OTHER PUBLICATIONS

Metal oxides as a hole-injecting layer for an organic electroluminescent device Shizuo Tokito et al 1996 J. Phys. D: Appl. Phys. 29 2750.*

Machine translation of JP 2000-306669.*

Switchable vanadium oxide films by a a sol-gel process, Partlow et al., Westinghouse Science and Technology Center, Mar. 26, 1991.*

Nakata et al., Multi Photon Emission Organic EL Devices Using Charge-Transfer Complex as Charge Generation Layer, The 63$^{rd}$ Autumn Meeting, Sep. 24, 2002, 27a-ZL-12, p. 1165.

International Search Report (Application No. PCT/JP2005/018225) dated Nov. 15, 2005.

Written Opinion (Application No. PCT/JP2005/018225) dated Nov. 15, 2005.

* cited by examiner

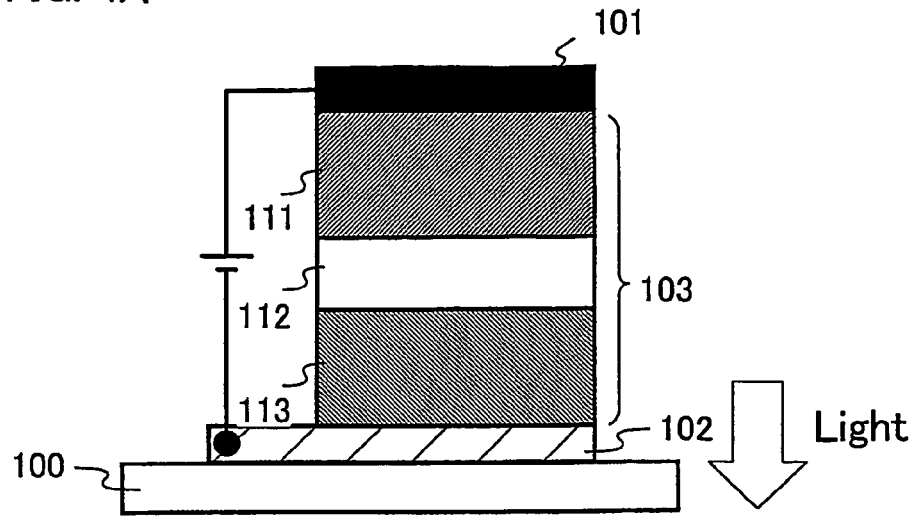
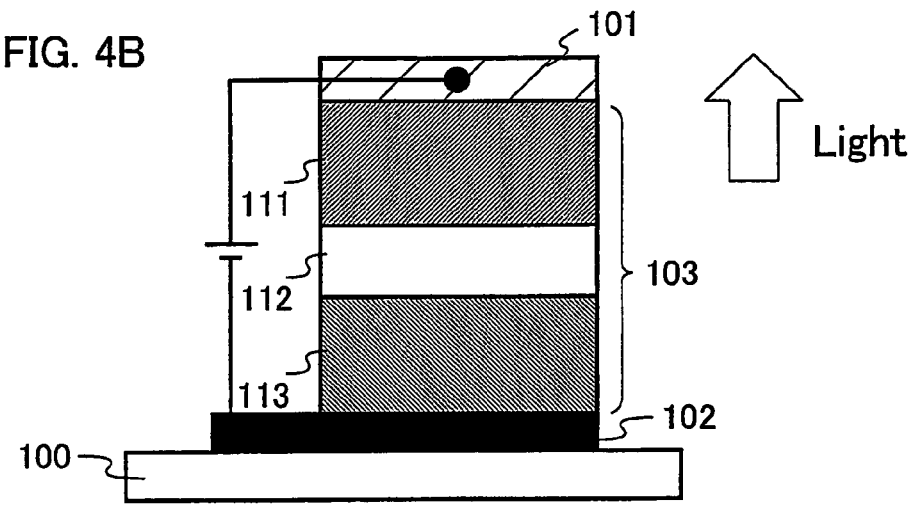
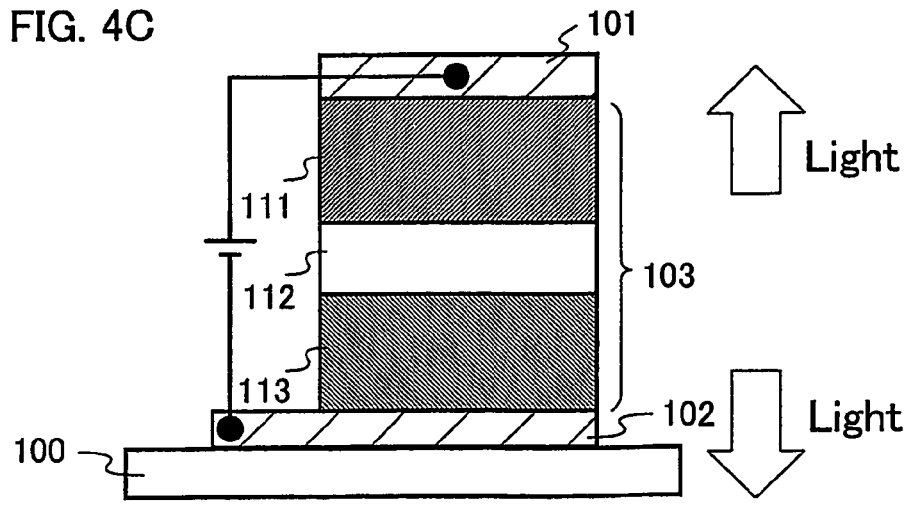

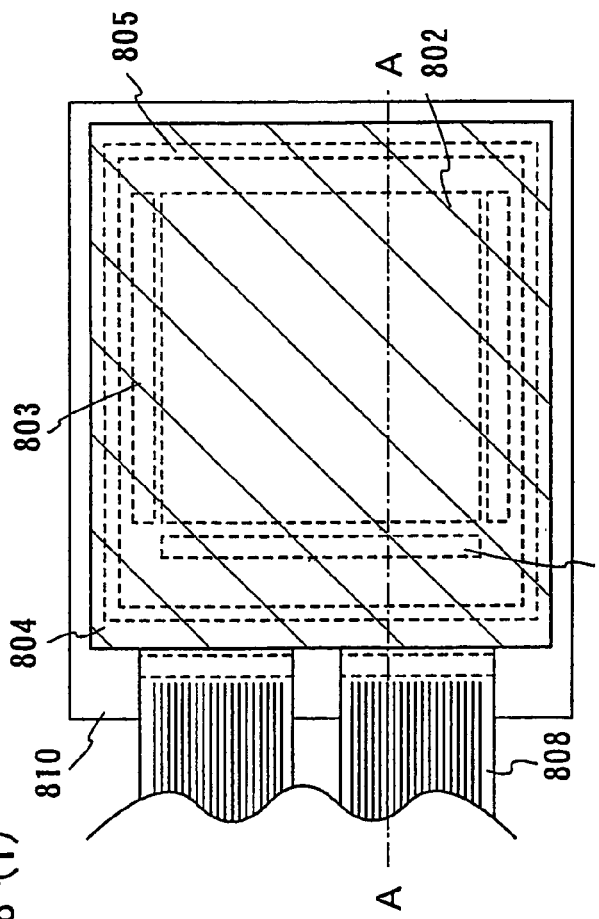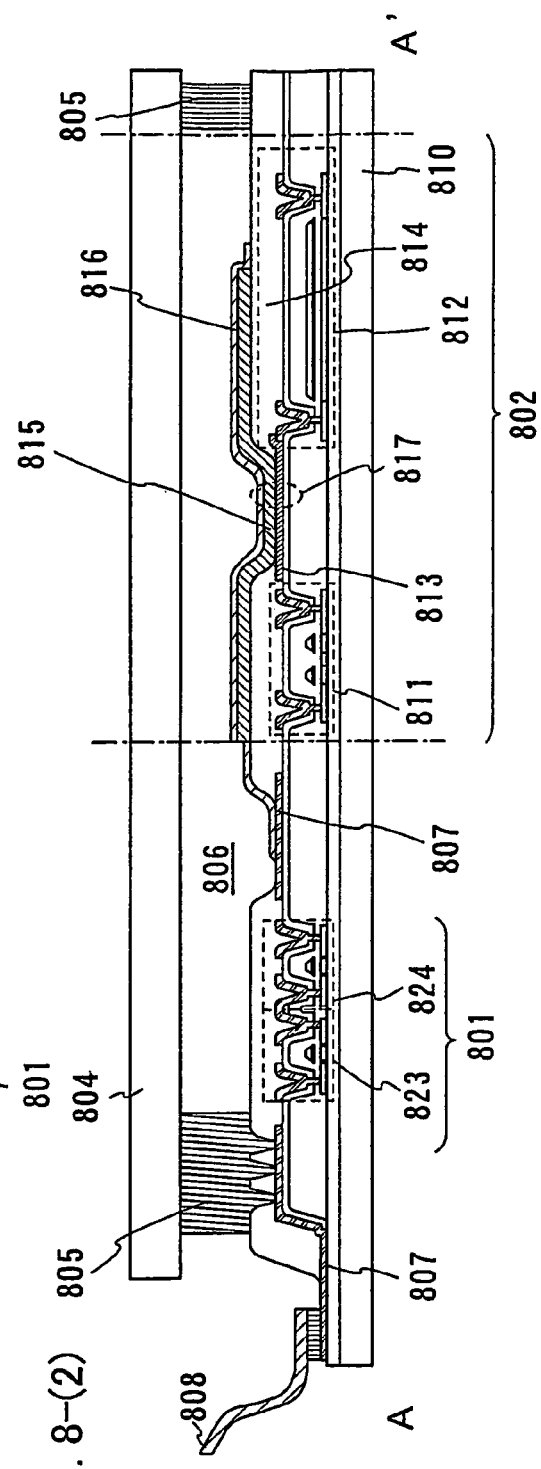
FIG. 8-(1)
FIG. 8-(2)

LIGHT-EMITTING-ELEMENT

TECHNICAL FIELD

The present invention relates to a light-emitting element, and more particularly to a light-emitting element including a composite layer in which an organic compound and an inorganic compound are mixed, and in addition, relates to a light-emitting device including a light-emitting element.

BACKGROUND ART

Recently, a light-emitting element that provides a high luminance by applying a current to an organic compound, such as a light-emitting element using a luminescent organic compound (referred to as an organic light-emitting diode [OLED] or an organic EL element, and hereinafter referred to as an organic EL element), has been getting a lot of attention.

In the fundamental structure of an organic EL element, a layer including a luminescent organic compound (light-emitting layer) is sandwiched between a pair of electrodes. By applying a voltage to this element, electrons and holes are transported respectively from the pair of electrode to the light-emitting element, and a current then flows. Then, those carriers (electrons and holes) are recombined to generate an excited state by the luminescent organic compound, and luminescence is produced when the excited state returns to the ground state.

It is to be noted that the excited state generated by an organic compound can be types of a singlet excited state and a triplet excited state, and luminescence from the singlet excited state is referred to as fluorescence, and luminescence from the triplet excited state is referred to as phosphorescence.

Since this organic EL element is usually formed by using an approximately submicron thin film, it is a great advantage that the organic EL element can be manufactured to be thin and lightweight. In addition, since the time from carrier injection to luminescence is on the order microseconds or less, it is also one of the features that the speed of response is quite fast. Further, since sufficient luminescence can be obtained at a direct voltage of several to several tens of volts, the power consumption is relatively low. From these advantages, organic EL elements have been getting a lot of attention as next-generation flat panel displays.

In addition, since the organic EL element is formed to have the shape of a film, planar light emission can be obtained easily by forming a large area element. This is a feature that is hard to obtain in point sources typified by a filament lamp and an LED or linear sources typified by a fluorescent light. Therefore, the organic EL elements also serve many uses as surface light sources that can be applied to lighting and the like.

However, these organic EL elements have problems with heat resistance and durability, which are drags on development of the organic EL elements. Since an organic EL element is usually formed by stacking organic thin films using organic compounds as typified in the following Patent Document 1, low durability of the organic compounds and the fragile organic thin film are considered to be causes of the problems described above.

On the other hand, there have been attempts to form a light-emitting element by using not an organic thin film but a layer in which an organic compound and an inorganic compound are mixed. For example, the following Patent Document 1 discloses a light-emitting element using a light-emitting layer in which fluorescent organic molecules are dispersed in a metal oxide. In addition, the following Patent Document 2 discloses a light-emitting element formed by stacking a layer in which organic compounds (a hole transporting compound, an electron transporting compound, and a luminescent compound) are dispersed in a silica matrix while being covalently bound to the silica matrix. In these references, it is reported that the durability and heat resistance of the element is improved.

(Non-Patent Reference 1) C. W. Tang, et al., Applied Physics Letters, Vol. 51, No. 12, 913-915 (1987)

(Patent Reference 1) Japanese Patent Application Laid-Open No. 2-288092

(Patent Reference 2) Japanese Patent Application Laid-Open No. 2000-306669

DISCLOSURE OF INVENTION

In the light-emitting elements as disclosed in the Patent Document 1 and 2, the organic compound is simply dispersed in the metal oxide of insulation. Therefore, the light-emitting elements have a problem that current is hard to flow (that is, the voltage needed to apply a current gets higher) as compared with conventional organic EL elements.

In these light-emitting elements, since the luminance gets higher in proportion to an applied current density, the fact that current is hard to flow namely leads to a problem that the voltage for obtaining a luminance (that is, driving voltage) also gets higher. Accordingly, when the organic compound is simply dispersed in the metal oxide, increase in driving voltage and increase in power consumption with the increase in driving voltage are caused even supposing that durability and heat resistance can be obtained.

In addition, in order to suppress short circuit of a light-emitting element due to dust and the like, it is effective to make the film thickness of the light-emitting element thicker. However, when the film thickness is made thicker in the structure as shown in Patent Document 1 or 2, the increase in driving voltage is further exposed. Namely, in the conventional structure, it is difficult for practical purposes to make the film thickness thicker.

FIG. 2 shows the conventional light-emitting element disclosed in Patent Document 2 described above, where a composite layer 203 in which the organic compounds are dispersed in the silica matrix is sandwiched between a first electrode (anode) 201 and a second electrode (cathode) 202. Namely, reference numerals 211, 213, and 212 are respectively a hole transporting layer in which the hole transporting compound is dispersed in the silica matrix, an electron transporting layer in which the electron transporting compound is dispersed in the silica matrix, and a light-emitting layer in which the luminescent compound is dispersed in the silica matrix, although the whole composite layer 203 is composed of the silica matrix. When a voltage is applied to this element, it is believed that holes and electrons are injected respectively from the first electrode (anode) 201 and the second electrode (cathode) 202 and recombined in the light-emitting layer 212, and that the luminescent compound then produces luminescence.

The hole transporting layer 211 and the electron transporting layer 213 take on carrier transport in this element. However, the element has a problem that current is hard to flow since the organic compounds are dispersed in the silica matrix of insulation. For example, in the hole transporting layer 211, holes move by hopping in the hole transporting compound existing in the hole transporting layer 211, and the silica matrix of insulation is not involved in hole transport.

Adversely, the silica matrix is a barrier to hopping of holes. The same can apply to the electron transporting layer 213. Accordingly, the driving voltage is obviously increased also as compares with conventional organic EL elements.

In addition, even when there is an attempt to make the film thickness of the composite layer 203 thicker for the purpose of preventing short circuit of the element or an optical design, the increase in driving voltage is further significant. Therefore, it is also difficult in practice to make the film thickness thicker.

Consequently, it is an object of the present invention to provide a light-emitting element that uses a material in which an organic compound and an inorganic compound are mixed and has a novel structure different from conventional structures, a light-emitting element that uses a material in which an organic compound and an inorganic compound are mixed and decreases in driving voltage, and a light-emitting element that uses a material in which an organic compound and an inorganic compound are mixed and easily prevents short circuit.

A lot of earnest experiments and studies by the inventors have finally found out that the object can be achieved by applying a layer including an organic compound and an inorganic compound that is capable of accepting or donating electrons from or to the organic compound.

Namely, one of aspects of the present invention is a light-emitting element sandwiching a composite layer including an organic compound and an inorganic compound between a pair of electrodes, where the composite layer includes a first layer, a second layer, and a third layer that are sequentially stacked, the first layer includes a first organic compound and a first inorganic compound that exhibits an electron accepting property to the first organic compound, the second layer includes a second organic compound that is luminescent and a second inorganic compound, the third layer includes a third organic compound and a third inorganic compound that exhibits an electron donating property to the third organic compound.

In this case, it is preferable to use a hole transporting organic compound as the first organic compound, and more preferably, the first organic compound is an organic compound having an aromatic amine skeleton. In addition, it is preferable to use an electron transporting organic compound as the third organic compound, and more preferably, the third organic compound is one of a chelate metal complex having a chelate ligand including an aromatic ring, an organic compound having a phenanthroline skeleton, and an organic compound having an oxadiazole skeleton.

It is preferable to use a metal oxide or a metal nitride as the first inorganic compound, and more preferably, the first inorganic compound is one of transition metal oxides each having a transition metal that belongs to any one of Groups 4 to 12 of the periodic table. Of the transition metal oxides, many of transition metal oxides each having a transition metal that belongs to any one of Groups 4 to 8 have a higher electron accepting property. In particular, vanadium oxide, molybdenum oxide, rhenium oxide, and tungsten oxide are preferred.

It is preferable to use a metal oxide or a metal nitride as the second inorganic compound, and more preferably, the second inorganic compound is one of transition metal oxides each having a metal that belongs to Group 13 or 14 of the periodic table since luminescence of the second organic compound coexisting in the second layer is not easily subject to quenching by these metal oxides. Of the metal oxides, aluminum oxide, gallium oxide, silicon oxide, and germanium oxide are preferred.

It is preferable to use a metal oxide or a metal nitride as the third inorganic compound, and more preferably, the third inorganic compound is one of alkali metal oxides, alkali-earth metal oxides, rare-earth metal oxides, alkali metal nitrides, alkali-earth metal nitrides, and rare-earth metal nitrides. Many of these metal oxides and metal nitrides have an electron donating property, and particularly, lithium oxide, barium oxide, lithium nitride, magnesium nitride, and calcium nitride are preferred.

Further, another aspect of the present invention is a light-emitting element sandwiching a composite layer including an organic compound and an inorganic compound between a pair of electrodes, where the composite layer includes a first layer, a second layer, a third layer, and a fourth layer that are sequentially stacked, the first layer includes a first organic compound and a first inorganic compound that exhibits an electron accepting property to the first organic compound, the second layer includes a second organic compound that is luminescent and a second inorganic compound, the third layer includes a third organic compound and a third inorganic compound that exhibits an electron donating property to the third organic compound, and the fourth layer includes a fourth organic compound and a fourth inorganic compound that exhibits an electron accepting property to the fourth organic compound.

In this case, it is preferable to use a hole transporting organic compound as at least one of the first organic compound and the fourth organic compound, and more preferably, at least one of the first organic compound and the fourth organic compound is an organic compound having an aromatic amine skeleton. In addition, it is preferable to use an electron transporting organic compound as the third organic compound, and more preferably, the third organic compound is one of a chelate metal complex having a chelate ligand including an aromatic ring, an organic compound having a phenanthroline skeleton, and an organic compound having an oxadiazole skeleton.

It is preferable to use a metal oxide or a metal nitride as at least one of the first inorganic compound and the fourth inorganic compound, and more preferably, at least one of the first organic compound and the fourth organic compound is one of transition metal oxides each having a transition metal that belongs to any one of Groups 4 to 12 of the periodic table. Of the transition metal oxides, many of transition metal oxides each having a transition metal that belongs to any one of Groups 4 to 8 have a higher electron accepting property. In particular, vanadium oxide, molybdenum oxide, tungsten oxide, and rhenium oxide are preferred.

It is preferable to use a metal oxide or a metal nitride as the second inorganic compound, and more preferably, the second inorganic compound is one of transition metal oxides each having a metal that belongs to Group 13 or 14 of the periodic table since luminescence of the second organic compound coexisting in the second layer is not easily subject to quenching by these metal oxides. Of the metal oxides, aluminum oxide, gallium oxide, silicon oxide, and germanium oxide are preferred.

It is preferable to use a metal oxide or a metal nitride as the third inorganic compound, and more preferably, the third inorganic compound is one of alkali metal oxides, alkali-earth metal oxides, rare-earth metal oxides, alkali metal nitrides, alkali-earth metal nitrides, and rare-earth metal nitrides. Many of these metal oxides and metal nitrides have an electron donating property, and particularly, lithium oxide, barium oxide, lithium nitride, magnesium nitride, and calcium nitride are preferred.

Since the above-described light-emitting elements according to the present invention, unlike a conventional light-emitting element that has a layer in which an organic compound and an inorganic compound are simply mixed, have features that currents easily flow and the driving voltages can be reduced, power consumption can be reduced also for a light-emitting device that has the light-emitting element according to the present invention. Therefore, the present invention includes a light-emitting device that has the light-emitting element according to the present invention.

The light-emitting device in the specification indicates an image display device or light emitter using a light-emitting element. In addition, a module that has a connector, for example, a flexible printed circuit (FPC), a TAB (Tape Automated Bonding) tape, or a TCP (Tape Carrier Package), attached to a light-emitting element, a module that has a printed wiring board provided at the tip of a TAB tape or a TCP, and a module that has an IC (integrated circuit) directly mounted on a light-emitting element by a COG (Chip On Glass) method are all included in the light-emitting device.

The practice of the present invention makes it possible to provide a light-emitting element that uses a material in which an organic compound and has a novel structure different from conventional structures, a light-emitting element that uses a material in which an organic compound and decreases in driving voltage, and a light-emitting element that uses a material in which an organic compound and easily prevents short circuit.

BRIEF DESCRIPTION OF DRAWINGS

In the accompanying drawings:

FIGS. 4A to 4C are diagrams illustrating emitting directions of light-emitting elements according to the present invention;

FIGS. 8-(1) and 8-(2) are diagrams illustrating a light-emitting device that has a light-emitting element according to the present invention;

BEST MODE FOR CARRYING OUT THE INVENTION

Embodiment modes of the present invention will be described below with reference to the accompanying drawings. However, the present invention may be embodied in a lot of different forms, and it is to be easily understood that various changes and modifications will be apparent to those skilled in the art unless such changes and modifications depart from the scope of the present invention. Therefore, the present invention is not to be construed with limitation to what is described in the embodiment modes.

Embodiment Mode 1

Figure 1:
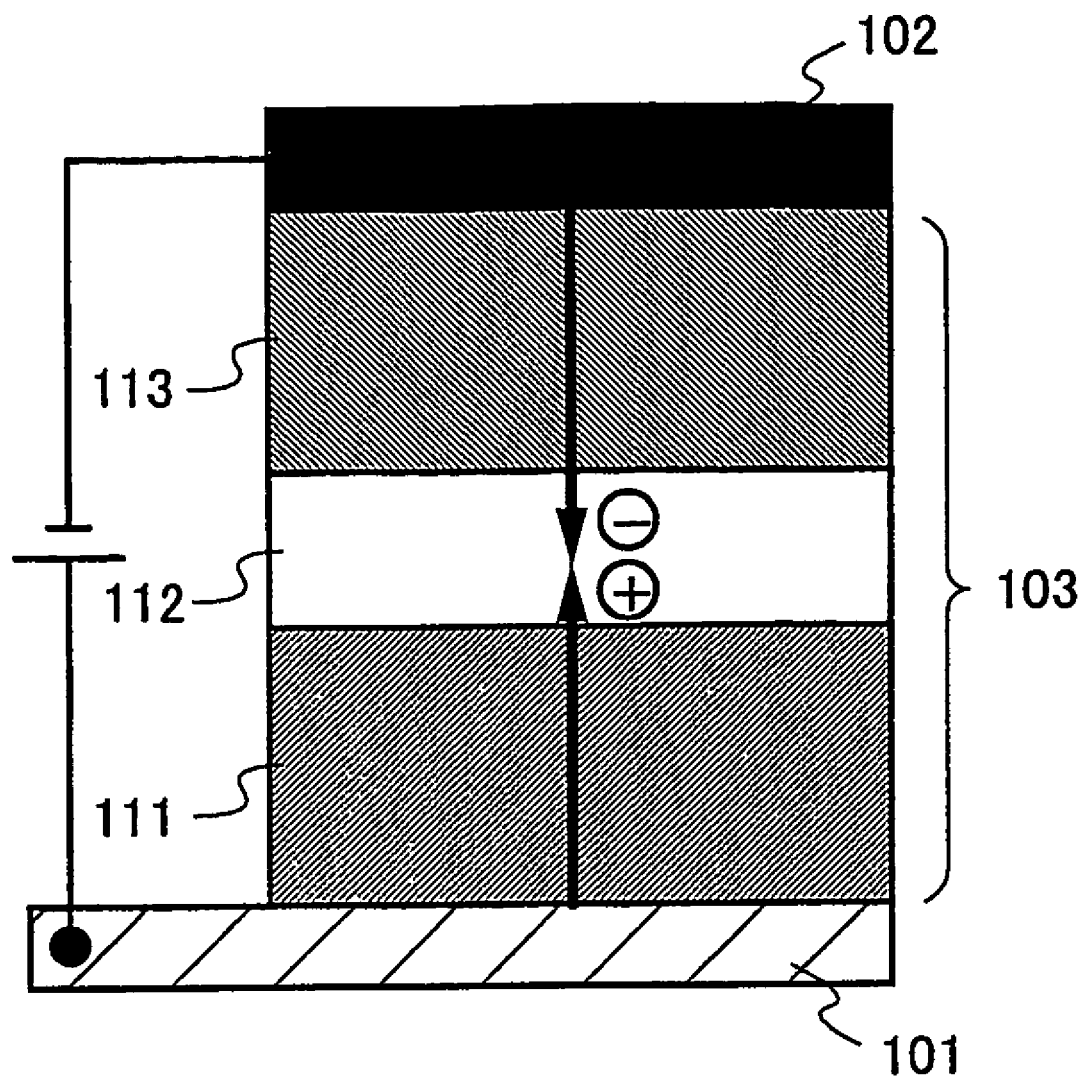
FIG. 1 is a diagram illustrating the structure of a light-emitting element according to the present invention.
Figure 2:
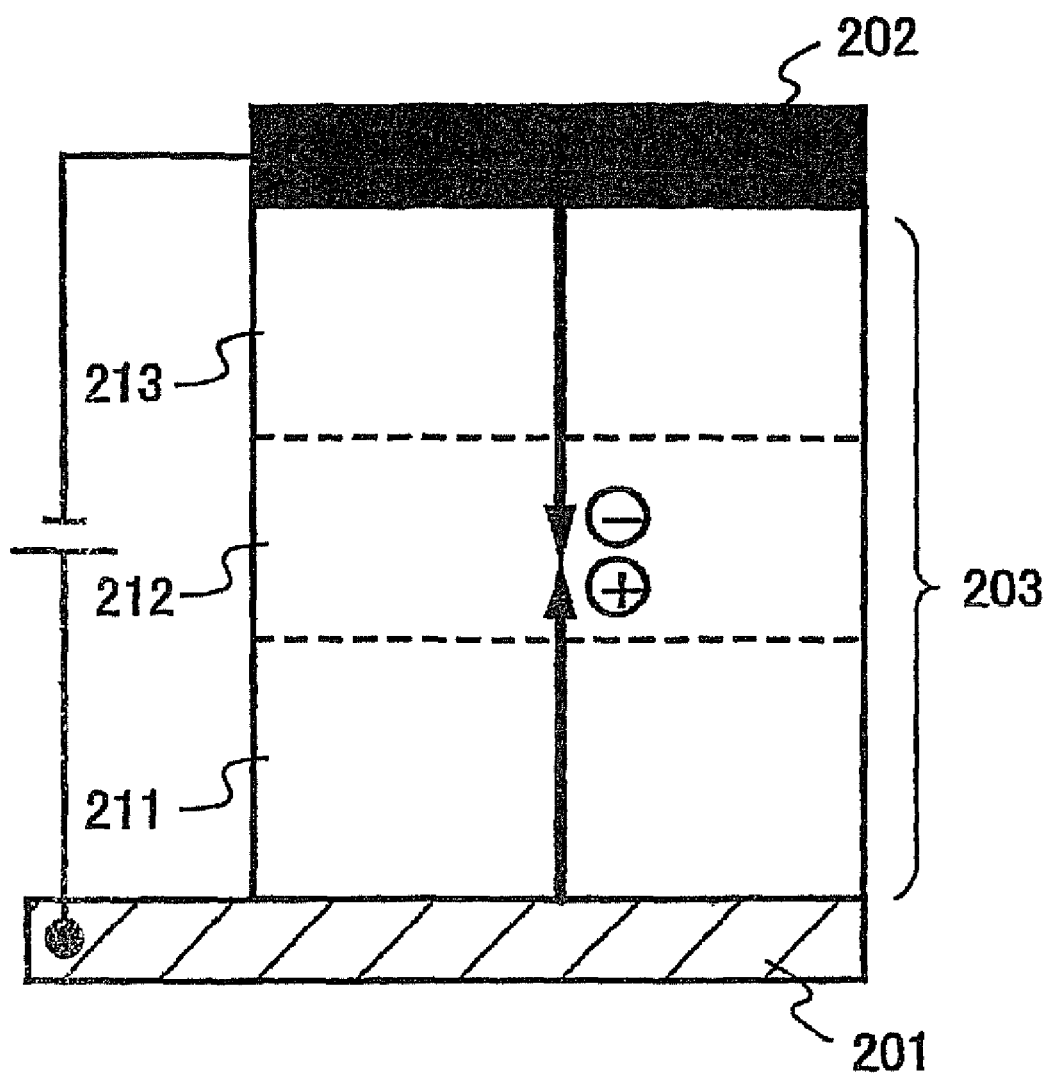
FIG. 2 is a diagram illustrating the structure of a conventional light-emitting element.

FIG. 1 shows the structure of a light-emitting element according to the present invention, where a composite layer 103 in which an organic compound and an inorganic compound are mixed is sandwiched between a first electrode 101 and a second electrode 102. The structure of the composite layer 103 is completely different from the structure of a composite layer 203 of a conventional light-emitting element (FIG. 2). The composite layer 103 has, as shown in the figure, a first layer 111, and a second layer 112, and a third layer 113, and in particular, the first layer 111 and the third layer 113 have significant features.

First, the first layer 111 is a layer that takes on the function of transporting holes to the second layer 112, and includes at least a first organic compound and a first inorganic compound that exhibits an electron accepting property to the first organic compound (serves as an electron acceptor). What is important is that the first inorganic compound is not only mixed with the first organic compound but also exhibits an electron accepting property to the first organic compound (serves as an electron acceptor). This structure generates a lot of hole carriers in the first organic compound, which originally has almost no inherent carrier, to provide an excellent hole injecting/transporting property.

Therefore, the first layer 111 provides not only advantages that are considered obtained by mixing an inorganic compound (for example, improvement in heat resistance) but also excellent conductivity (in particular, hole injecting and transporting properties in the case of the first layer 111). This excellent conductivity is an advantage that is not able to be obtained from a conventional hole transporting layer 211 (FIG. 2) in which an organic compound and an inorganic compound that do not electronically interact with each other are simply mixed. This advantage makes it possible to lower a driving voltage more than ever before. In addition, since the first layer 111 can be made thicker without causing an increase in driving voltage, short circuit of the element due to dust and the like can also be suppressed.

Meanwhile, it is preferable to use a hole-transporting organic compound as the first organic compound since hole carriers are generated in the first organic compound as described above. Examples of the hole-transporting organic compound include, but are not limited to, phthalocyanine (abbreviation: $H_2Pc$), copper phthalocyanine (abbreviation: CuPc), vanadyl phthalocyanine (abbreviation: VOPc), 4,4', 4"-tris(N,N-diphenylamino)-triphenylamine (abbreviation: TDATA), 4,4',4"-tris[N-(3-methylphenyl)-N-phenylamino]-triphenylamine (abbreviation: MTDATA), 1,3,5-tris[N,N-di(m-tolyl)amino]benzene (abbreviation: m-MTDAB), N,N'-diphenyl-N,N'-bis(3-methylphenyl)-1,1'-biphenyl-4,4'-diamine (abbreviation: TPD), 4,4'-bis[N-(1-naphthyl)-N-phenylamino]biphenyl (abbreviation: NPB), 4,4'-bis{N-[4-di(m-tolyl)amino]phenyl-N-phenylamino}biphenyl (abbreviation: DNTPD), and 4,4',4''-tris(N-carbazolyl)triphenylamine (abbreviation: TCTA). In addition, of the compounds mentioned above, aromatic amine compounds as typified by TDATA, MTDATA, m-MTDAB, TPD, NPB, DNTPD, and TCATA easily generate hole carriers, and are a suitable group of compounds for the first organic compounds.

While on the other hand, the first inorganic compound may be any material as long as the material easily accepts electrons from the first organic compound, and various metal oxides and metal nitrides can be used. However, transition metal oxides each having a transition metal that belongs to any one of Groups 4 to 12 of the periodic table are preferred since an electron accepting property is easily provided. Specifically, the transition metal oxides include titanium oxide, zirconium oxide, vanadium oxide, molybdenum oxide, tungsten oxide, rhenium oxide, ruthenium oxide, and zinc oxide. In addition, of the metal oxides mentioned above, many of transition metal oxides each having a transition metal that belongs to any one of Groups 4 to 8 have a higher electron accepting property, which are a preferable group of compounds. In particular, vanadium oxide, molybdenum oxide, tungsten oxide, and rhenium oxide are preferred since these oxides can be used easily for vacuum deposition.

It is to be noted that the first layer 111 may be formed by stacking a plurality of layers each including a combination of an organic compound and an inorganic compound as described above, or may further include another organic or inorganic compound.

Next, the third layer 113 will be described. The third layer 113 is a layer that takes on the function of transporting electrons to the second layer 112, includes at least a third organic compound and a third inorganic compound that exhibits an electron donating property to the third organic compound (serves as an electron donor). What is important is that the third inorganic compound is not only mixed with the third organic compound but also exhibits an electron donating property to the third organic compound (serves as an electron donor). This structure generates a lot of hole carriers in the third organic compound, which originally has almost no inherent carrier, to provide an excellent electron injecting/transporting property.

Therefore, the third layer 113 provides not only advantages that are considered obtained by mixing an inorganic compound (for example, improvement in heat resistance) but also excellent conductivity (in particular, electron injecting and transporting properties in the case of the third layer 113). This excellent conductivity is an advantage that is not able to be obtained from a conventional electron transporting layer 213 (FIG. 2) in which an organic compound and an inorganic compound that do not electronically interact with each other are simply mixed. This advantage makes it possible to lower a driving voltage more than ever before. In addition, since the first layer 113 can be made thicker without causing an increase in driving voltage, short circuit of an element due to dust and the like can also be suppressed.

Meanwhile, it is preferable to use an electron-transporting organic compound as the third organic compound since electron carriers are generated in the third organic compound as described above. Examples of the hole-transporting organic compound include, but are not limited to, tris(8-quinolinolato)aluminum (abbreviation: Alq$_3$), tris(4-methyl-8-quinolinolato)aluminum (abbreviation: Almq$_3$), bis(10-hydroxybenzo[h]quinolinato)beryllium (abbreviation: BeBq$_2$), bis(2-methyl-8-quinolinolato)(4-phenylphenolato)-aluminum (abbreviation: BAlq), bis[2-(2'-hydroxyphenyl)-benzoxazolato]zinc (abbreviation: ZnBOX) or bis[2-(2'-hydroxyphenyl)benzothiazolato]zinc (abbreviation: Zn(BTZ)$_2$), bathophenanthroline (abbreviation: BPhen), bathocuproin (abbreviation: BCP), 2-(4-biphenylyl)-5-(4-tert-butylphenyl)-1,3,4-oxadiazole (abbreviation: PBD), 1,3-bis[5-(4-tert-butylphenyl)-1,3,4-oxadiazole-2-yl]benzene (abbreviation: OXD-7), 2,2',2''-(1,3,5-benzenetriyl)-tris(1-phenyl-1H-benzimidazole) (abbreviation: TPBI), 3-(4-biphenylyl)-4-phenyl-5-(4-tert-butylphenyl)-1,2,4-triazole (abbreviation: TAZ), and 3-(4-biphenylyl)-4-(4-ethylphenyl)-5-(4-tert-butylphenyl)-1,2,4-triazole (abbreviation: p-EtTAZ). In addition, of the compound mentioned above, chelate metal complexes each having a chelate ligand including an aromatic ring as typified by Alq$_3$, Almq$_3$, BeBq$_2$, BAlq, Zn(BOX)$_2$, and Zn(BTZ)$_2$, organic compounds each having a phenanthroline skeleton as typified by BPhen and BCP, and organic compounds each having an oxadiazole skeleton as typified by PBD and OXD-7 easily generate electron carriers, and are suitable groups of compounds for the third organic compounds.

While on the other hand, the third inorganic compound may be any material as long as the material easily donates electrons from the third organic compound, and various metal oxides and metal nitrides can be used. However, alkali metal oxides, alkali-earth metal oxides, rare-earth metal oxides, alkali metal nitrides, alkali-earth metal nitrides, and rare-earth metal nitrides are preferred since an electron donating property is easily provided. Specifically, examples of the oxides mentioned above include lithium oxide, strontium oxide, barium oxide, erbium oxide, lithium nitride, magnesium nitride, calcium nitride, yttrium nitride, and lanthanum nitride. In particular, lithium oxide, barium oxide, lithium nitride, magnesium nitride, and calcium nitride are preferred since these oxides and nitrides can be used easily for vacuum deposition.

It is to be noted that the third layer 113 may be formed by stacking a plurality of layers each including a combination of an organic compound and an inorganic compound as described above, or may further include another organic compound or inorganic compound.

Next, the second layer 112 will be described. The second layer 112 is a layer that takes on the function of emitting light, and includes at least a second organic compound that is luminescent and a second inorganic compound. The second layer may have the same structure as a light-emitting layer 212 in FIG. 2, and can be formed by mixing some of various luminescent organic compounds and inorganic compounds. However, since it is believed that it is hard to apply a current to the second layer 112 as compared with the first layer 111 or the third layer 113, it is preferable that the thickness of the second layer 112 be approximately 10 to 100 nm.

The second organic compound is not particularly limited as long as a luminescent organic compound is used, and examples of the second organic compound include 9,10-di(2-naphthyl)anthracene (abbreviation: DNA), 9,10-di(2-naphthyl)-2-tert-butylanthracene (abbreviation: t-BuDNA), 4,4'-bis(2,2-diphenylvinyl)biphenyl (abbreviation: DPVBi), coumarin 30, coumarin 6, coumarin 545, coumarin 545T, perylene, rubrene, periflanthene, 2,5,8,11-tetra(tert-butyl) perylene (abbreviation: TBP), 9,10-diphenylanthracene (abbreviation: DPA), 4-(dicyanomethylene)-2-methyl-[p-(dimethylamino)styryl]-4H-pyran (abbreviation: DCM1), 4-(dicyanomethylene)-2-methyl-6-[2-(julolidine-9-yl) ethenyl]-4H-pyran (abbreviation: DCM2), and 4-(dicyanomethylene)-2,6-bis[p-(dimethylamino)styryl]-4H-pyran (abbreviation: BisDCM). In addition, it is also possible to used compounds that are capable of producing phosphorescence such as bis[2-(4',6'-difluorophenyl)pyridinato-N,C$^{2'}$]iridium (picolinate) (abbreviation: FIrpic), bis{2-[3',5'-bis(trifluoromethyl)phenyl]pyridinato-N, $C^{2'}$}iridium (picolinate) (abbreviation: Ir($CF_3$ppy)$_2$(pic)), tris(2-phenylpyridinato-N,$C^{2'}$)iridium (abbreviation: Ir(ppy)$_3$), bis(2-phenylpyridinato-N,$C^{2'}$)iridium (acetylacetonate) (abbreviation: Ir(ppy)$_2$(acac)), bis[2-(2'-thienyl)pyridinato-N,$C^{3'}$]iridium (acetylacetonate) (abbreviation: Ir(thp)$_2$(acac)), bis(2-phenylquinolinato-N,$C^{2'}$)iridium (acetylacetonate) (abbreviation: Ir(pq)$_2$(acac)), and bis[2-(2'-benzothienyl) pyridinato-N,$C^{3'}$]iridium (acetylacetonate) (abbreviation: Ir(btp)$_2$(acac)).

Further, the second layer 112 may include not only the second organic compound described above, which produces luminescence, but also another organic compound added. Examples of organic compounds that can be added include, but are not limited to, TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, DNA, t-BuDNA, and DPVBi, which are mentioned above, and further, 4,4'-bis(N-carbazolyl)-biphenyl (abbreviation: CBP) and 1,3,5-tris[4-(N-carbazolyl)-phenyl]benzene (abbreviation: TCPB). It is to be noted that it is preferable that the organic compound, which is added in addition to the second organic compound as described above, have larger excitation energy than the second organic compound and be added more than the second organic compound in order to make the second organic compound produce luminescence efficiently (which makes it possible to prevent concentration quenching of the second organic compound). In addition, as another function, the added organic compound may produce luminescence along with the second organic compound (which makes it possible to produce a white luminescence).

The second inorganic compound may be any inorganic material as long as luminescence of the second organic compound is not easily subject to quenching by the inorganic compound, and various metal halides, metal oxides, metal nitrides can be used. In particular, metal oxides each having a metal that belongs to Group 13 or 14 of the periodic table are preferred since luminescence of the second organic compound is not easily subject to quenching, and specifically, aluminum oxide, gallium oxide, silicon oxide, and germanium oxide are preferred. However, the second inorganic compound is node limited these, and lithium fluoride, calcium fluoride, and magnesium fluoride can be also used.

It is to be noted that the second layer 112 may be formed by stacking a plurality of layers each including a combination of an organic compound and an inorganic compound as described above, or may further include another organic or inorganic compound.

Next, materials that can be used for the first electrode 101 or the second electrode 102 will be described. It is preferable to use a material that has a larger work function (specifically, a material that has a work function of 4.5 eV or more) for the first electrode 101 and a material that has a smaller work function (specifically, a material that has a work function of 3.5 eV or less) for the second electrode 102. However, since the first layer 111 and the third layer 113 are respectively superior in hole injecting/transporting property and electron injecting/transporting property, either the first electrode 101 or the second electrode 102 is subjected to almost no restriction on work function, and various materials can be used for the first electrode and the second electrode 102.

At least one of the first electrode 101 and the second electrode 102 has a light-transmitting property. In that case, a transparent conductive film may be used specifically, for which indium tin oxide (ITO), indium zinc oxide (IZO), indium tin oxide doped with silicon oxide (ITSO), and the like can be used. In addition, any one of the first electrode 101 and the second electrode 102 may have a light blocking effect (particularly, reflectiveness), for which a conductive film including a metal such as titanium, tungsten, nickel, gold, platinum, silver, aluminum, magnesium, calcium, or lithium, a conductive film including an alloy of the metals, and the like can be used. Each of the first electrode 101 and the second electrode 102 may be an electrode formed by laminating a metal thin film such as aluminum silver, or gold and the transparent conductive film described above, which function as half mirrors.

It is to be noted that the light-emitting element according to the present invention has different variations by changing the types of the first electrode 101 and the second electrode 102. FIGS. 3A to 3C and FIGS. 4A to 4C show schematic views of the variations. It is to be noted that the reference numerals in FIG. 1 are cited in FIGS. 3A to 3C and FIGS. 4A to 4C, and that reference numeral 100 denotes a substrate supporting a light-emitting element according to the present invention.

Figure 3A:
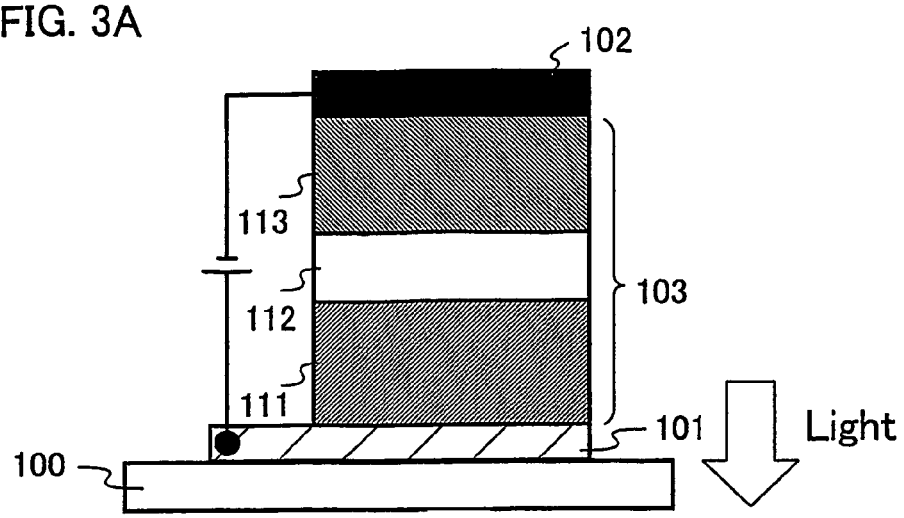
FIGS. 3A to 3C are diagrams illustrating emitting directions of light-emitting elements according to the present invention.
Figure 3B:
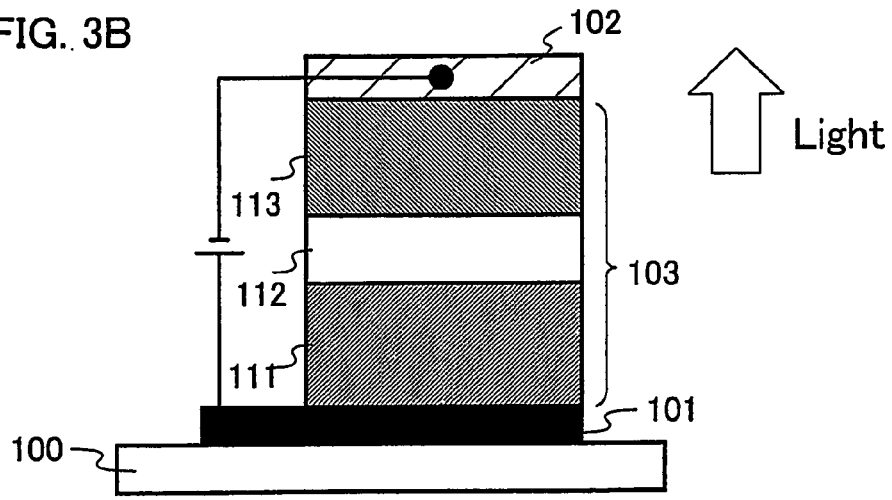
Figure 3C:
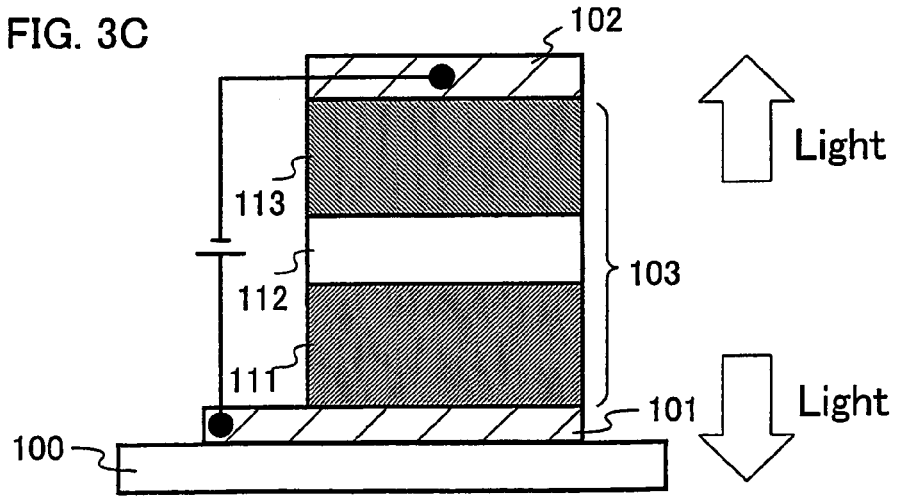

FIGS. 3A to 3C show cases each including the composite layer 103 formed by stacking the first layer 111, the second layer 112, and the third layer 113 in this order from the substrate 100 side. In these cases, when the first electrode 101 has a light-transmitting property and the second electrode 102 has a light blocking effect (in particular, reflectiveness), light is emitted from the substrate 100 side as shown in FIG. 3A. In addition, when the first electrode 101 has a light blocking effect (in particular, reflectiveness) and the second electrode 102 has a light-transmitting property, light is emitted from the side opposite to the substrate 100 as shown in FIG. 3B. Further, when both the first electrode 101 and the second electrode 102 have a light-transmitting property, light can be emitted from both the substrate 100 side and the side opposite to the substrate 100 as shown in FIG. 3C.

FIGS. 4A to 4C show cases each including the composite layer 103 formed by stacking the third layer 113, the second layer 112, and the first layer 113 in this order from the substrate 100 side. In these cases, when the first electrode 101 has a light blocking effect (in particular, reflectiveness) and the second electrode 102 has a light-transmitting property, light is extracted from the substrate 100 side as shown in FIG. 4A. In addition, when the first electrode 101 has a light-transmitting property and the second electrode 102 has a light blocking effect (in particular, reflectiveness), light is extracted from the side opposite to the substrate 100 as shown in FIG. 4B. Further, when both the first electrode 101 and the second electrode 102 have a light-transmitting property, light can be emitted from both the substrate 100 side and the side opposite to the substrate 100 as shown in FIG. 4C.

As described above, the layer sandwiched between the first electrode 101 and the second electrode 102 is composed of the composite layer 103 in the light-emitting element according to the present invention, and what is more is that the light-emitting element is a novel organic-inorganic composite light-emitting element provided with layers (that is, the first layer 111 and the third layer 113) that provide a function called a high carrier injecting/transporting property by mixing an organic compound and an inorganic compound, which is not obtainable from either the organic compound or the inorganic compound by itself. This structure is different from not only the light-emitting element shown in FIG. 2 but also conventional organic EL element and inorganic EL element. Therefore, a light-emitting element according to the present invention is hereinafter referred to as a composite electroluminescent element (CEL element).

Further, various known methods can be used as a method for forming the composite layer 103, which is a layer in which an organic compound and an inorganic compound are mixed.

For example, the known methods include a co-evaporation method of evaporating both an organic compound and an inorganic compound by resistance heating. In addition, for co-evaporation, an inorganic compound may be evaporated by an electron beam (EB) while evaporating an organic compound by resistance heating. Further, the known methods also include a method of sputtering an inorganic compound while evaporating an organic compound by resistance heating to deposit the both at the same time. In addition, deposition may be performed by a wet method.

In addition, for the first electrode 101 and the second electrode 102, evaporation by resistance heating, EB evaporation, sputtering, a wet method, and the like can be used in the same way.

Embodiment Mode 2

Figure 5:
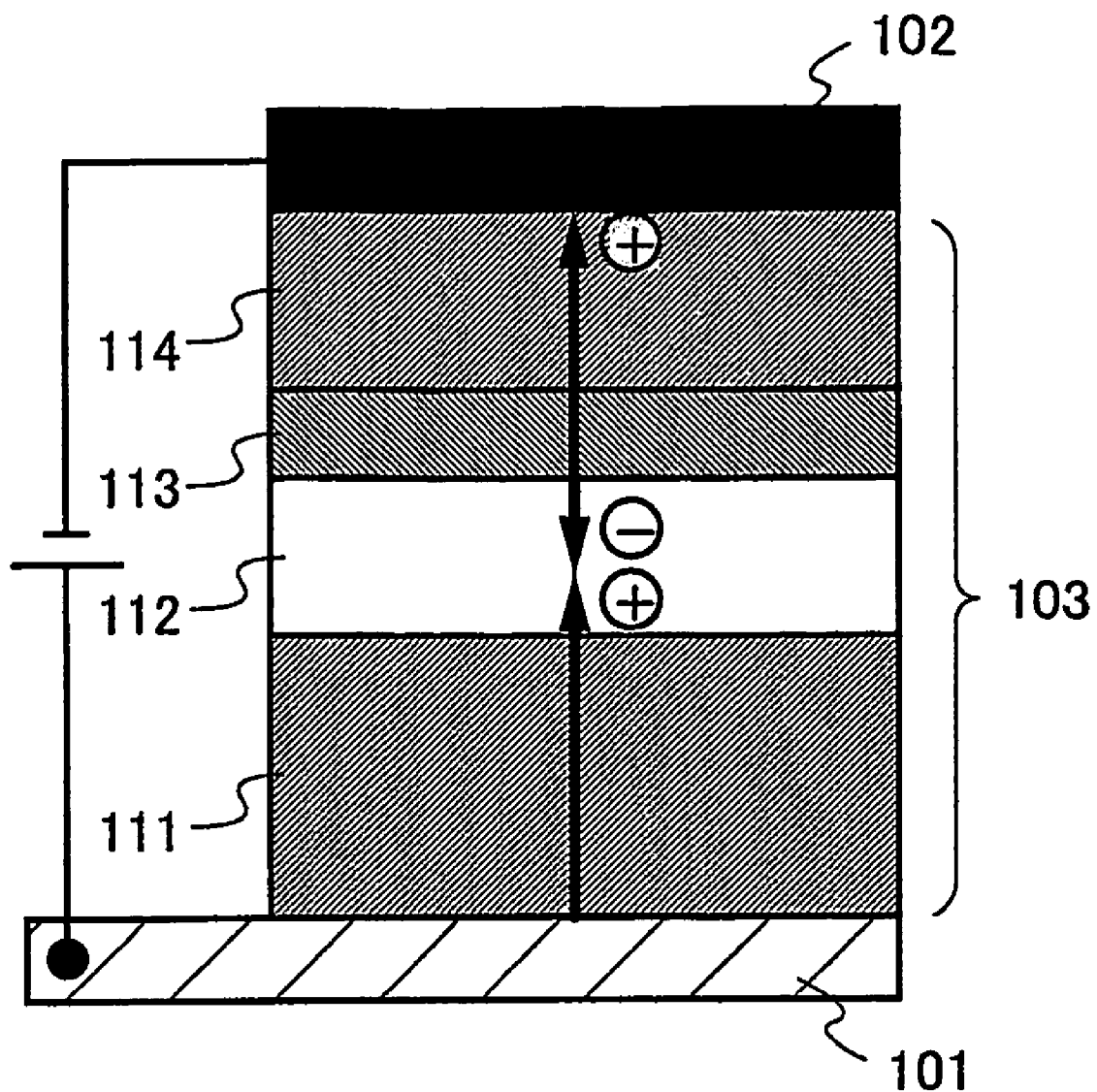
FIG. 5 is a diagram illustrating the structure of a light-emitting element according to the present invention.

In Embodiment Mode 2, an embodiment of a CEL element according to the present invention, which is different from Embodiment Mode 1, will be described. FIG. 5 shows the structure of the element. It is to be noted that the reference numerals in FIG. 1 are cited in FIG. 5.

FIG. 5 shows a light-emitting element sandwiching a composite layer 103 in which an organic compound and an inorganic compound are mixed between a first electrode 101 and a second electrode 102. As shown in the figure, the composite layer 103 includes a first layer 111, a second layer 112, a third layer 113, and a fourth layer 114.

Since the same structures as the respective layers in Embodiment Mode 1 (that is, FIG. 1) can be applied to the first electrode 101, the second electrode 102, the first layer 111, the second layer 112, and the third layer 113, explanations thereof are omitted. The thing that is different from Embodiment Mode 1 is that the fourth layer 114 is provided between the third layer 113 and the second electrode 102.

The fourth layer 114 includes at least a fourth organic compound and a fourth inorganic compound that exhibits an electron accepting property to the fourth organic compound (serves as an electron acceptor). Therefore, the same compound as the first organic compound cited in Embodiment Mode 1 can be used as the fourth organic compound, and the same compound as the first inorganic compound cited in Embodiment Mode 1 can be used as the fourth inorganic compound. However, as the fourth organic compound, the same compound as the first organic compound may be used, or a different compound from the first organic compound may be used. In addition, as the fourth inorganic compound, the same compound as the first organic compound may be used, or a different compound from the first organic compound may be used.

In this structure described above, as described in FIG. 5, electrons are donated and accepted in the vicinity of the interface between the third layer 113 and the fourth layer 114 by applying a voltage, electrons and holes are generated, and the fourth layer 114 transports the holes to the second electrode 102 while the third layer 113 transports the electrons to the second layer 112. Namely, the combination of the third layer 113 and the fourth layer 114 serves as a carrier generating layer. In addition, it can be said that the fourth layer 114 takes on the function of transporting holes to the second electrode 102. Further, it is also possible to have a multiphoton light-emitting element by stacking another second layer and third layer additionally between the fourth layer 114 and the second electrode 102.

In addition, as will be described later in Embodiment 1, a mixed layer (that is, the first layer 111 or the fourth layer 114) including an organic compound and an inorganic compound that exhibits an electron accepting property to the organic compound (serves as an electron acceptor) exhibits an extremely high hole injecting/transporting property. Therefore, the layers on the sides of the composite layer 103 can be made much thicker in the CEL element in Embodiment Mode 2 as compared with Embodiment Mode 1, and further, short circuit of the element can be prevented effectively. In addition, to take FIG. 5 as an example, it is also possible to reduce damage to the second layer 112 in which a luminescent organic compound is existing, for example, when the second electrode 102 is deposited by sputtering. Further, the advantage that stress strain is suppressed can be expected by forming the first layer 111 and the fourth layer 114 with the use of the same material since the layers on the sides of the composite layer 103 are formed with the used of the same material.

It is to be noted that the CEL element according to Embodiment Mode 2 also has, as in Embodiment Mode 1, different variations by changing the types of the first electrode 101 and the second electrode 102. FIGS. 6A to 6C and FIGS. 7A to 7C show schematic views of the variations. It is to be noted that the reference numerals in FIG. 5 are cited in FIGS. 6A to 6C and FIGS. 6A to 6C, and that reference numeral 100 denotes a substrate supporting a CEL element according to the present invention.

Figure 6A:
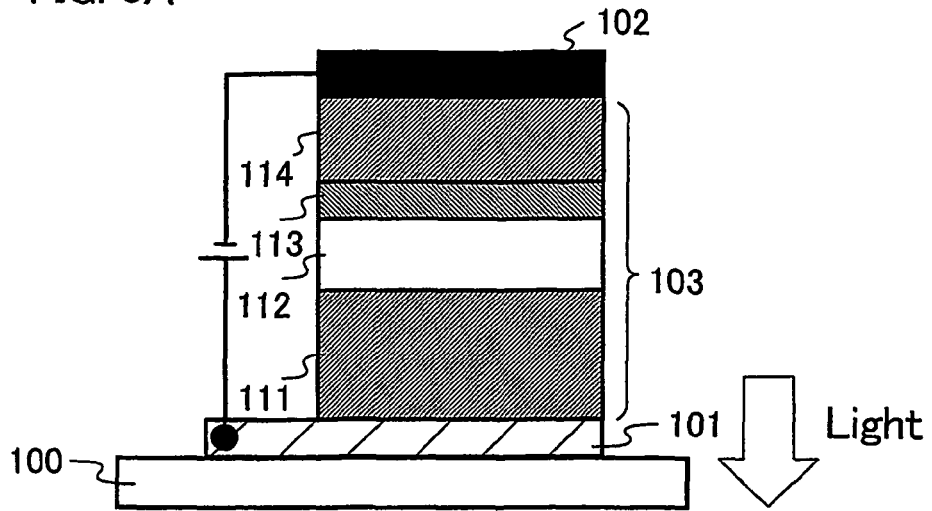
FIGS. 6A to 6C are diagrams illustrating emitting directions of light-emitting elements according to the present invention.
Figure 6B:
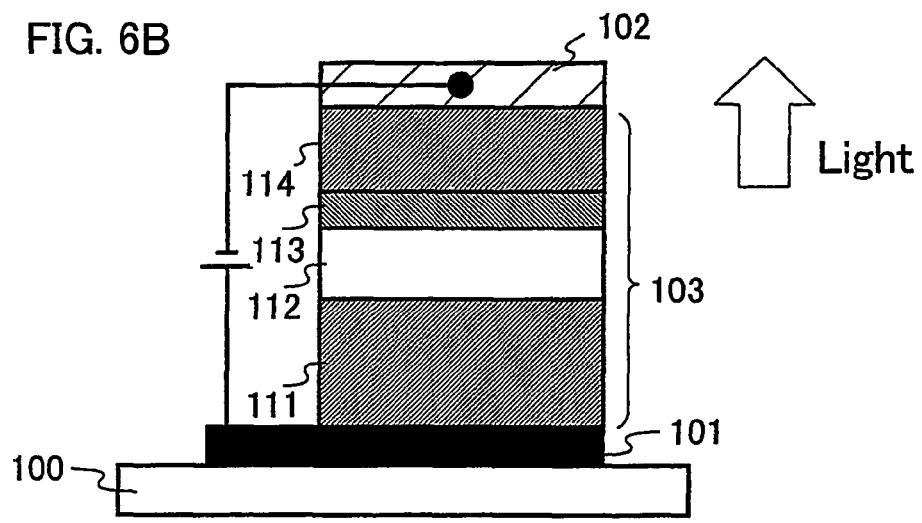
Figure 6C:
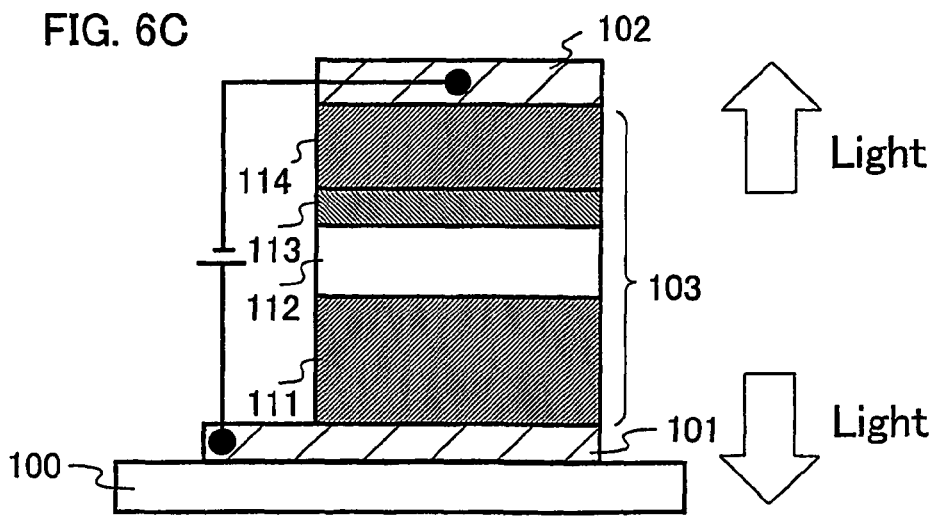
Figure 7A:
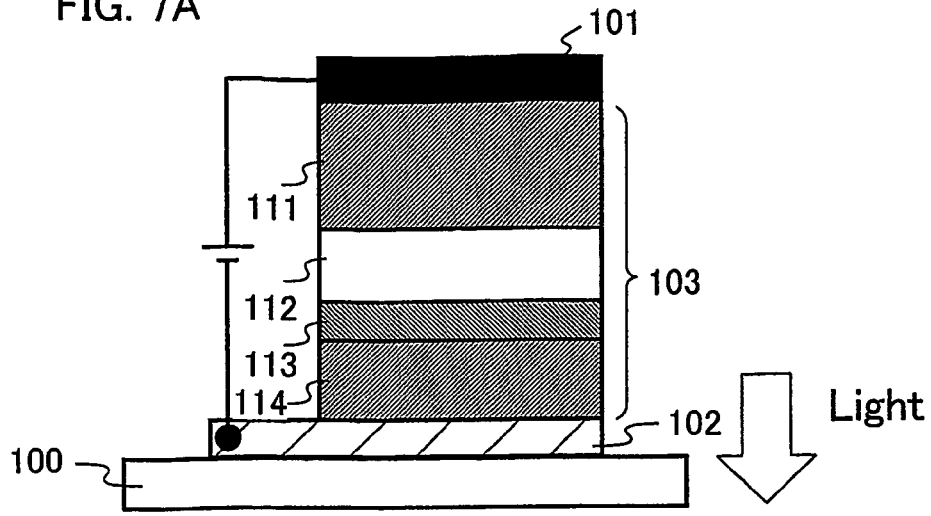
FIGS. 7A to 7C are diagrams illustrating emitting directions of light-emitting elements according to the present invention.
Figure 7B:
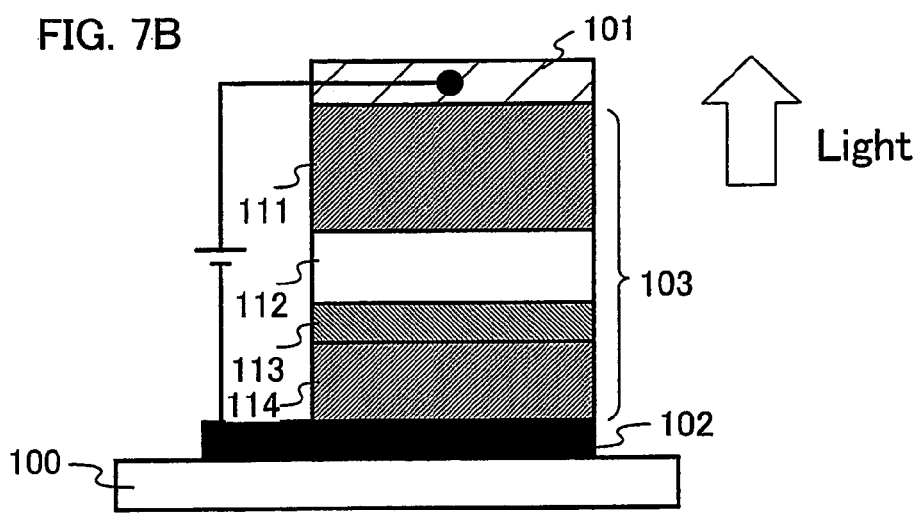

FIGS. 6A to 6C show cases each including the composite layer 103 formed by stacking the first layer 111, the second layer 112, the third layer 113, and the fourth layer 114 in this order from the substrate 100 side. In these cases, when the first electrode 101 has a light-transmitting property and the second electrode 102 has a light blocking effect (in particular, reflectiveness), light is emitted from the substrate 100 side as shown in FIG. 7A. In addition, when the first electrode 101 has a light blocking effect (in particular, reflectiveness) and the second electrode 102 has a light-transmitting property, light is emitted from the side opposite to the substrate 100 as shown in FIG. 7B. Further, when both the first electrode 101 and the second electrode 102 have a light-transmitting property, light can be emitted from both the substrate 100 side and the side opposite to the substrate 100 as shown in FIG. 7C.

Figure 7C:
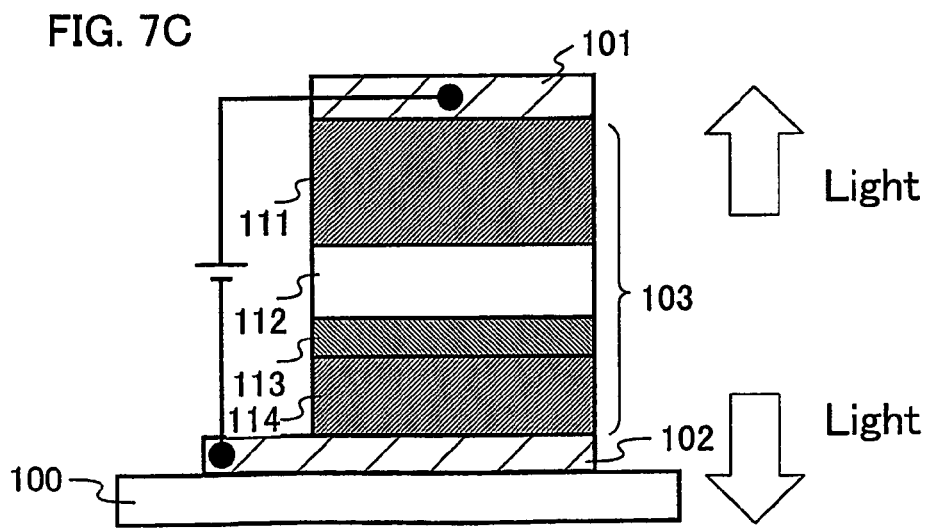

FIGS. 7A to 7C show cases each including the composite layer 103 formed by stacking the fourth layer 114, the third layer 113, the second layer 112, and the first layer 113 in this order from the substrate 100 side. In these cases, when the first electrode 101 has a light blocking effect (in particular, reflectiveness) and the second electrode 102 has a light-transmitting property, light is extracted from the substrate 100 side as shown in FIG. 7A. In addition, when the first electrode 101 has a light-transmitting property and the second electrode 102 has a light blocking effect (in particular, reflectiveness), light is extracted from the side opposite to the substrate 100 as shown in FIG. 7B. Further, when both the first electrode 101 and the second electrode 102 have a light-transmitting property, light can be emitted from both the substrate 100 side and the side opposite to the substrate 100 as shown in FIG. 7C.

Further, various known methods can be used as a method for forming the composite layer 103, which is a layer in which an organic compound and an inorganic compound are mixed. For example, the known methods include a co-evaporation method of evaporating both an organic compound and an inorganic compound by resistance heating. In addition, for co-evaporation, an inorganic compound may be evaporated by an electron beam (EB) while evaporating an organic compound by resistance heating. Further, the known methods also include a method of sputtering an inorganic compound while evaporating an organic compound by resistance heating to deposit the both at the same time. In addition, deposition may be performed by a wet method.

In addition, for the first electrode 101 and the second electrode 102, evaporation by resistance heating, EB evaporation, sputtering, a wet method, and the like can be used in the same way.

Embodiment Mode 3

In the present embodiment mode, a light-emitting device that has a CEL element according to the present invention in a pixel portion will be described with reference to FIGS. 8-(1) and 8-(2). FIG. 8-(1) is a top view showing the light-emitting device and FIG. 8-(2) is a cross-sectional view taken along A-A' in FIG. 8-(2). Reference numeral 801 indicated by a dotted line denotes a source-side driver circuit, reference numeral 802 denotes a pixel portion, and reference numeral 803 denotes a gate-side driver circuit. In addition, reference numerals 804 and 805 denote a sealing substrate and a sealing material, respectively. A region 806 surrounded by the sealing material 805 may be a space filled with an inert gas or may be filled with a solid such as a resin.

A connecting wiring 807 for transmitting signals to be input to the source-side driver circuit 801 and the gate side driver circuit 803 receives signals such as a video signal, a clock signal, a start signal, and a reset signal from an FPC (Flexible Printed Circuit) 808 to serve as an external input terminal. It is to be noted that although only the FPC is shown here, a printed wiring board (PWB) may be attached to this FPC. The light-emitting device according to the present invention includes not only a light-emitting device body but also a state in which an FPC or a PWB is attached thereto.

Next, the sectional structure will be described with reference to FIG. 8-(2). Although the driver circuits and the pixel portion are formed over a substrate 810, the source-side driver circuit 801 as a driver circuit portion and the pixel portion 802 are shown here.

In the source-side driver circuit 801, a CMOS circuit is formed by a combination of an n-channel TFT 823 and a p-channel TFT 824. The TFTs forming the driver circuit may be formed by using a known CMOS circuit, PMOS circuit, or NMOS circuit. Although the present embodiment mode shows a driver integrated type in which a driver circuit is formed over a substrate, which is not always necessary, the driver circuit can be formed not over the substrate but outside the substrate.

Further, the pixel portion 802 has a plurality of pixels, each including a switching TFT 811, a current controlling TFT 812, and a first electrode 813 electrically connected to a drain of the controlling TFT 812. In addition, an insulator 814 is formed to cover an edge portion of the first electrode 813. Here, a positive photosensitive acrylic resin film is used to form the insulator 814.

Besides, in order to obtain a favorable coverage, the insulator 814 is formed so as to have a top portion or a bottom portion with a curved surface that has a curvature. For example, in the case of using a positive photosensitive acrylic as a material for the insulator 814, it is preferable that only a top portion of the insulator 814 have a curved surface with a curvature radius (0.2 to 3 μm). In addition, any of a negative photosensitive material that is insoluble in an etchant by light and a positive photosensitive material that is soluble in an etchant by light can be used for the insulator 814.

On the first electrode 813, a composite layer 815 and a second electrode 816 are formed to form a CEL element structure. The structures described in Embodiment Mode 1 or 2 may be applied to the structures of the first electrode 813, the composite layer 815, and the second electrode 816.

Further, the sealing substrate 804 and the substrate 810 are bonded with the sealing material 805 to have a structure where the CEL element 817 is provided in the region surrounded by the substrate 810, the sealing substrate 804, and the sealing material 805. It is to be noted that the region 806 also includes a structure of filling with the sealing material 805 in addition to a case of filling with an inert gas (for example, nitrogen or argon).

It is to be noted that it is preferable to use an epoxy resin for the sealing material 805. In addition, it is desirable to use a material that allows permeation of moisture or oxygen as little as possible. Further, as a material to be used for the sealing substrate 804, a plastic substrate composed of FRP (Fiberglass-Reinforced Plastics), PVF (polyvinylfluoride), Mylar, polyester, acrylic, or the like can be used besides a glass substrate and a quarts substrate.

As described above, a light-emitting device that has a CEL element according to the present invention can be obtained.

Embodiment Mode 4

In the present embodiment mode, various electronic appliances completed by using a light-emitting device that has an CEL element according to the present invention will be described.

Electronic appliances according to the present invention include a video camera, a digital camera, a goggle-type display (head mount display), a navigation system, a sound reproduction device (for example, an in-car audio system or a audio component), a personal computer, a game machine, a personal digital assistance (for example, a mobile computer, a cellular phone, a portable game machine, or an electronic book), and an image reproduction device equipped with a recording medium (specifically, a device equipped with a display, which can reproduce a recording medium such as a Digital Versatile Disc (DVD) and display the image). Specific examples of these electronic appliances are shown in FIGS. 9A to 9G.

Figure 9A:
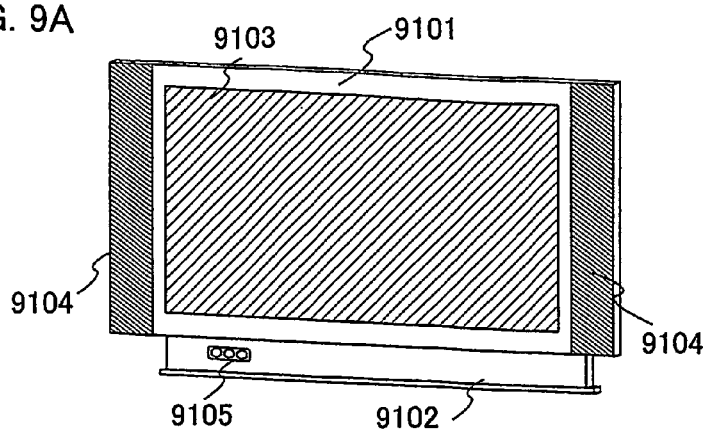
FIGS. 9A to 9G are diagrams illustrating electric appliances using a light-emitting device according to the present invention.

FIG. 9A shows a display device, which includes a frame body 9101, a support 9102, a display portion 9103, a speaker portion 9104, and a video input terminal 9105. The display device is manufactured by using a light-emitting device that has a CEL element according to the present invention for the display portion 9103. It is to be noted that the display device includes all devices for displaying information such as for a computer, for receiving TV broadcasting, and for displaying an advertisement. Since the driving voltage of the CEL element according to the present invention is lower, a display device with lower power consumption can be provided. In addition, since defects in pixels do not easily occur and the change in luminance with time is less, high-definition images can be displayed over a long period of time.

Figure 9B:
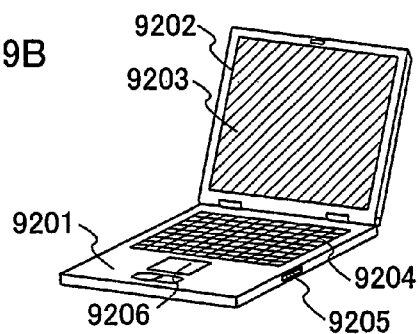

FIG. 9B shows a personal computer, which includes a main body 9201, a frame body 9202, a display portion 9203, a keyboard 9204, an external connection port 9205, and a pointing mouse 9206. The personal computer is manufactured by using a light-emitting device that has a CEL element according to the present invention for the display portion 9203. Since the driving voltage of the CEL element according to the present invention is lower, a laptop computer can be particularly used for a long time even when a battery is used. In addition, since defects in pixels do not easily occur and the change in luminance with time is less, high-definition images can be displayed over a long period of time.

Figure 9C:
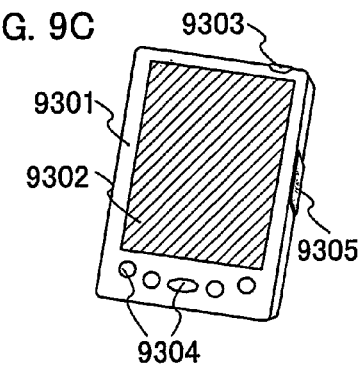

FIG. 9C shows a mobile computer, which includes a main body 9301, a display portion 9302, a switch 9303, operation keys 9304, and an infrared port 9305. The mobile computer is manufactured by using a light-emitting device that has a CEL element according to the present invention for the display portion 9302. Since the driving voltage of the CEL element according to the present invention is lower, the power consumption of the mobile computer can be lowered. Thus, the mobile computer can be used for a long time by recharging the mobile computer once. In addition, since a battery incorporated in the mobile computer can be miniaturized, the mobile computer can be reduced in weight.

Figure 9D:
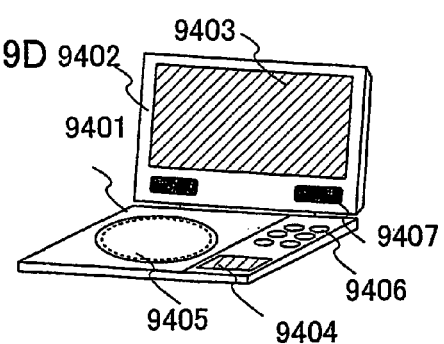

FIG. 9D shows a portable image reproduction device equipped with a recording medium (specifically, a DVD reproduction device), which includes a main body 9401, a frame body 9402, a display portion A 9403, a display portion B 9404, a recording medium (for example, a DVD) reading portion 9405, an operation key 9406, and a speaker portion 9407. The display portion A 9403 is used mainly for displaying image information while the display portion B 9404 is used mainly for displaying character information. The portable image reproduction device is manufactured by using a light-emitting device that has a CEL element according to the present invention for the display portion A 9403 and the display portion B 9404. The image reproduction device equipped with the recording medium further includes a home game machine and the like. Since the driving voltage of the CEL element according to the present invention is lower, an image reproduction device with lower power consumption can be provided. In addition, since defects in pixels do not easily occur and the change in luminance with time is less, high-definition images can be displayed over a long period of time.

Figure 9E:
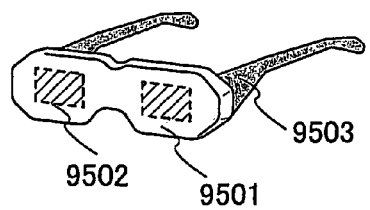

FIG. 9E shows a goggle-type display (head mount display), which includes a main body 9501, a display portion 9502, and an arm portion 9503. The goggle-type display (head mount display) is manufactured by using a light-emitting device that has a CEL element according to the present invention for the display portion 9502. Since the driving voltage of the CEL element according to the present invention is lower, a goggle-type display with lower power consumption can be provided. In addition, since defects in pixels do not easily occur and the change in luminance with time is less, high-definition images can be displayed over a long period of time.

Figure 9F:
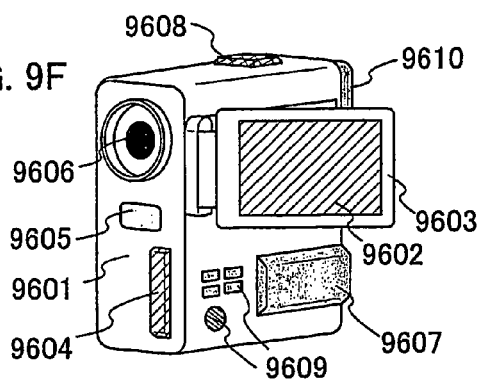

FIG. 9F shows a video camera, which includes a main body 9601, a display portion 9602, a frame body 9603, an external connection port 9604, a remote-control receiving portion 9605, an image receiving portion 9606, a battery 9607, a sound input portion 9608, operation keys 9609, and an eye piece 9610. The video camera is manufactured by using a light-emitting device that has a CEL element according to the present invention for the display portion 9602. Since the driving voltage of the CEL element according to the present invention is lower, the power consumption of the video camera can be lowered. Thus, the video camera can be used for a long time by recharging the video camera once. In addition, since a battery incorporated in the video camera can be miniaturized, the video camera can be reduced in weight.

Figure 9G:
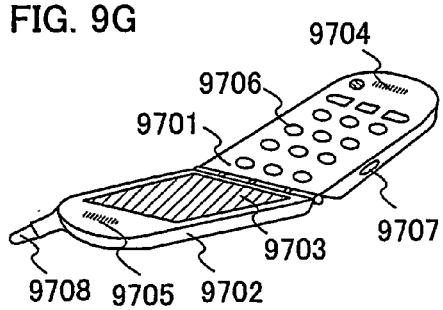

FIG. 9G shows a cellular phone, which includes a main body 9701, a frame body 9702, a display portion 9703, a sound input portion 9704, a sound output portion 9705, an operation key 9706, an external connection port 9707, and an antenna 9708. The cellular phone is manufactured by using a light-emitting device that has a CEL element according to the present invention for the display portion 9703. Since the driving voltage of the CEL element according to the present invention is lower, the cellular phone of the mobile computer can be lowered. Thus, the cellular phone can be used for a long time by recharging the cellular phone once. In addition, since a battery incorporated in the cellular phone can be miniaturized, the cellular phone can be reduced in weight.

As described above, a light-emitting device that has a CEL element according to the present invention is capable of quite wide application, and can be applied to electronic appliances in all fields.

Embodiment 1

In Embodiment 1, concerning a layer in which an organic compound and inorganic compound are mixed, examination cases for the combination of the organic compound and the inorganic compound will be exemplified.

Deposition Example 1

First, a glass substrate is fixed in a substrate holder in a vacuum deposition system. Then, NPB and molybdenum oxide (VI) are respectively put different evaporation sources of a resistance-heating type, and a mixed layer including NPB and molybdenum oxide is formed by co-evaporation while drawing a vacuum. In this case, NPB is evaporated at a deposition rate of 0.4 nm/s, and molybdenum oxide is evaporated so that the weight ratio of molybdenum oxide to NPB is ¼. Therefore, the mole ratio is NPB:molybdenum oxide=1:1. It is to be noted that the film thickness of the mixed layer is made 50 nm.

Figure 10:
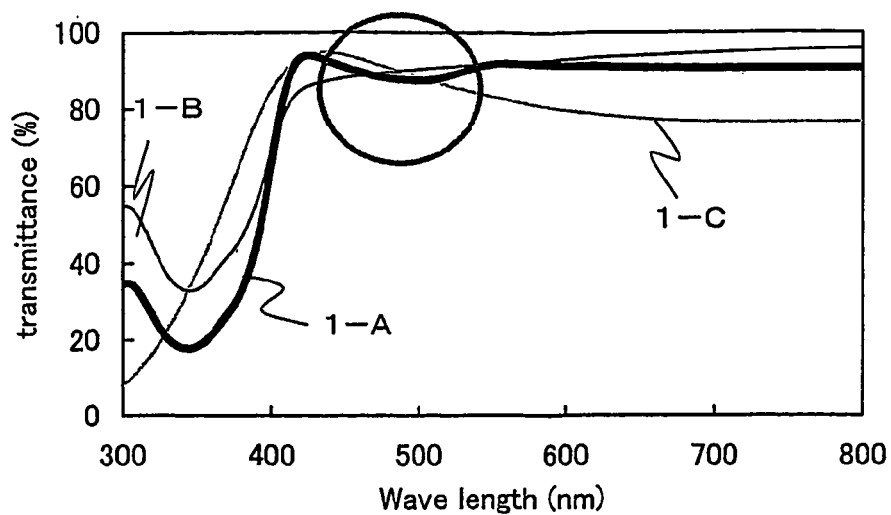
FIG. 10 is a diagram showing a transmission spectrum of a film in which an organic compound and an inorganic compound are mixed.

The result of measuring a transmission spectrum of the thus deposited mixed layer including NPB and molybdenum oxide is shown by 1-A in FIG. 10. For comparison, a transmission spectrum of an NPB film (1-B in FIG. 10) and a transmission spectrum of a molybdenum oxide film (1-C in FIG. 10) are shown together.

As is understood from FIG. 10, in the case of the mixed film shown by 1-A, new absorption (a portion circled in FIG. 10) is observed, which is not observed in the case of each film of NPB or molybdenum oxide by itself. It is believed that this is because electrons are donated and accepted between the NPB and the molybdenum oxide so the molybdenum oxide accepts electrons from the NPB to generate holes in the NPB.

Therefore, the mixed layer including NPB and molybdenum oxide, which is deposited in Deposition Example 1, can be used as the first layer and/or the fourth layer in the CEL element according to the present invention.

Deposition Example 2

A transmission spectrum of a mixed film including m-MTDAB and molybdenum oxide is measured, where the mixed film is manufactured in the same way as in Deposition Example 1 by replacing NPB in Deposition Example 1 with m-MTDAB. The result is shown by 2-A in FIG. 11. For comparison, a transmission spectrum of an m-MTDAB film (2-B in FIG. 11) and a transmission spectrum of a molybdenum oxide film (2-C in FIG. 11) are shown together.

Figure 11:
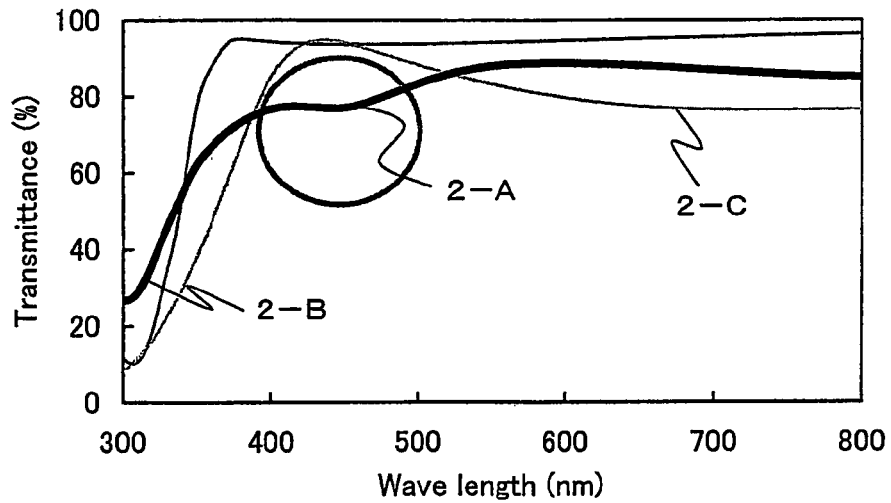
FIG. 11 is a diagram showing a transmission spectrum of a film in which an organic compound and an inorganic compound are mixed.

As is understood from FIG. 11, in the case of the mixed film shown by 2-A, new absorption (a portion circled in FIG. 11) is observed, which is not observed in the case of each film of m-MTDAB or molybdenum oxide by itself. It is believed that this is because electrons are donated and accepted between the m-MTDAB and the molybdenum oxide so the molybdenum oxide accepts electrons from the m-MTDAB to generate holes in the m-MTDAB.

Therefore, the mixed layer including m-MTDAB and molybdenum oxide, which is deposited in Deposition Example 2, can be used for the first layer and/or the fourth layer in the CEL element according to the present invention.

Deposition Example 3

A transmission spectrum of a mixed film including $Alq_3$ and molybdenum oxide is measured, where the mixed film is manufactured in the same way as in Deposition Example 1 by replacing NPB in Deposition Example 1 with $Alq_3$. The result is shown by 3-A in FIG. 12. For comparison, a transmission spectrum of an $Alq_3$ film (3-B in FIG. 12) and a transmission spectrum of a molybdenum oxide film (3-C in FIG. 12) are shown together.

Figure 12:
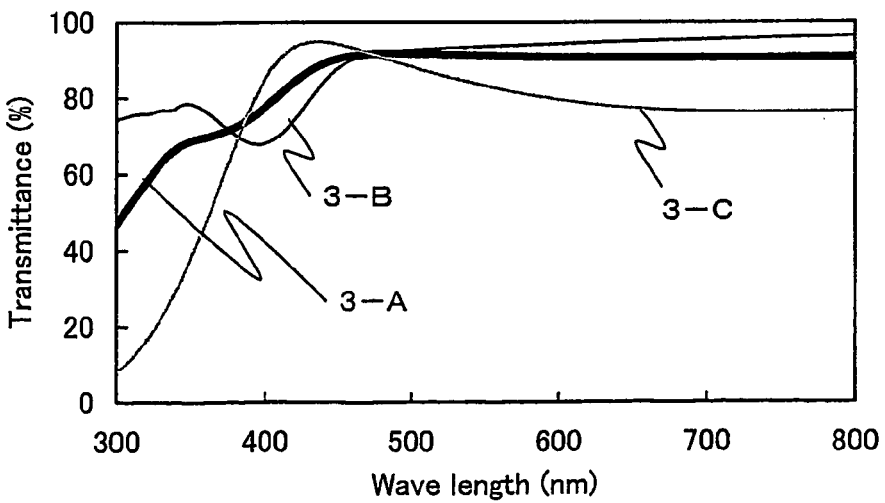
FIG. 12 is diagram showing a transmission spectrum of a film in which an organic compound and an inorganic compound are mixed.

As is understood from FIG. 12, the transmission spectrum of the mixed film, which is shown by 3-A, is a mere combination of the transmission spectrum of $Alq_3$ by itself (3-B) and the transmission spectrum of molybdenum oxide by itself (3-C), and new absorption is not generated. This indicates that electrons are not donated or accepted between the $Alq_3$ and the molybdenum oxide. Namely, in this case, it can be said that no level with respect to the $Alq_3$ is formed by the molybdenum oxide so that luminescence of $Alq_3$ is not easily subject to quenching.

Therefore, the mixed layer including $Alq_3$ and molybdenum oxide, which is deposited in Deposition Example 3, can be used for the second layer in the CEL element according to the present invention.

Embodiment 2

In Embodiment 2, concerning a layer in which an organic compound and inorganic compound are mixed, the result of examining electrical characteristics will be described.

First, a glass substrate on which an ITSO 110 nm in film thickness is deposited is prepared. The surface of the ITSO has a periphery covered with an insulating film to expose a portion of the surface (size: 2 mm on a side).

Next, the glass substrate is fixed in a substrate holder in a vacuum deposition system so that the side with the ITSO formed is made down. Then, NPB and molybdenum oxide (VI) are respectively put different evaporation sources of a resistance-heating type, and a mixed layer including NPB and molybdenum oxide is formed by co-evaporation while drawing a vacuum. In this case, NPB is evaporated at a deposition rate of 0.4 nm/s, and molybdenum oxide is evaporated so that the weight ratio of molybdenum oxide to NPB is ½. Therefore, the mole ratio is NPB:molybdenum oxide=1:2. It is to be noted that the film thickness of the mixed layer is made 50 nm. Further, aluminum (Al) is deposited thereon to be 150 nm.

Figure 13:
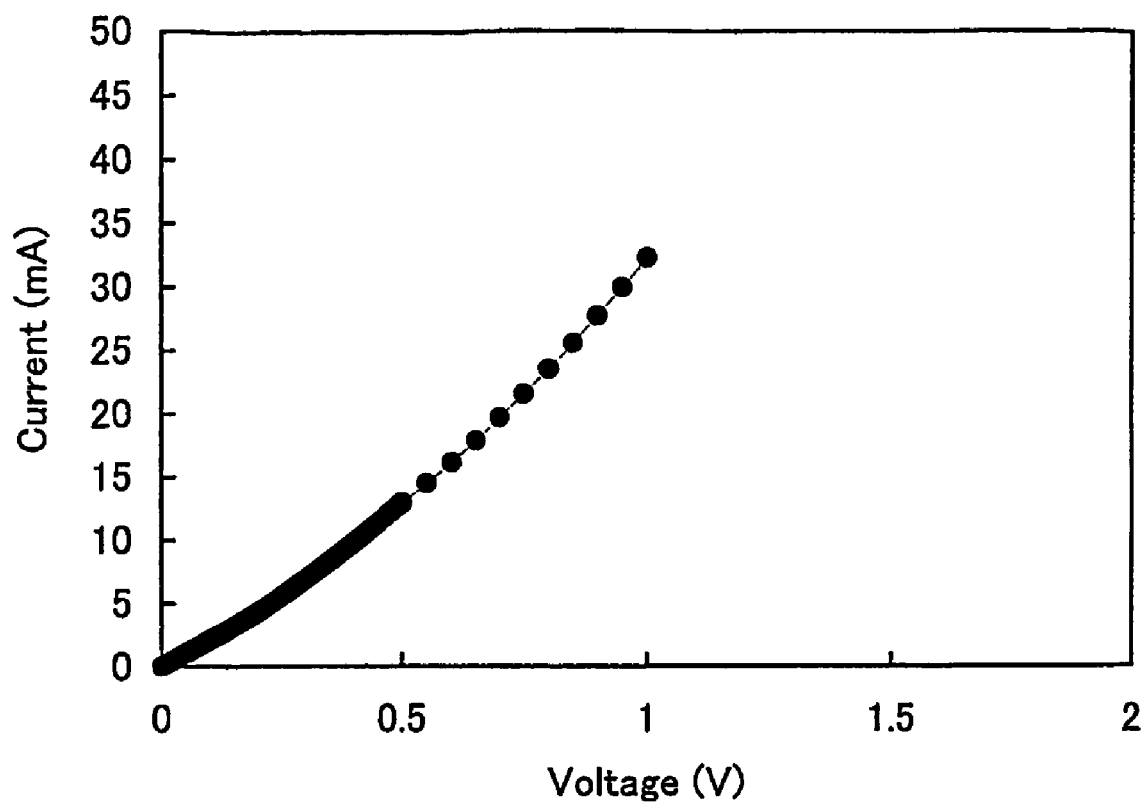
FIG. 13 is a diagram showing voltage-current characteristics of a film in which an organic compound and an inorganic compound are mixed.

Concerning the thus obtained laminated structure of the ITSO, the mixed layer including NPB and molybdenum oxide, and the Al, FIG. 13 shows the result of examining voltage-current characteristics. As shown in FIG. 13, it is determined that the voltage-current characteristics are almost linear while being a slightly convex downward curve and the current in accordance with Ohm's law is thus dominant. Therefore, it is believed that there is almost no hole injection barrier between the ITSO and the mixed layer, which suggests that holes are efficiently injected and transported. It is to be noted that the resistivity $\rho$ in this case is $\rho=(0.5/0.0129)\times(4\times 10^{-6})/(50\times 10^{-9})=3.1\times 10^3$ [$\Omega$m] since it is 12.9 mA that flows when a voltage of 0.5 V is applied, the electrode (ITSO) area is 4 mm², and the film thickness is 50 nm. Accordingly, the resistivity $\rho$ is in the range of a semiconductor.

From the result described above, the mixed layer including NPB and molybdenum oxide has an excellent hole injecting/transporting property, and can be used for the first layer and/or the fourth layer in the CEL element according to the present invention.

Embodiment 3

In Embodiment 3, a specific structure of the CEL element according to the present invention, which is disclosed in Embodiment Mode 1, will be exemplified. It is to be noted that the reference numerals in FIG. 1 are cited in Embodiment 3.

First, a glass substrate on which an ITSO 110 nm in film thickness is deposited is prepared. The deposited ITSO functions as the first electrode 101 in the present embodiment.

Next, the glass substrate with the first electrode 101 formed is fixed in a substrate holder in a vacuum deposition system so that the side with the first electrode 101 formed is made down. Then, NPB and molybdenum oxide (VI) are respectively put different evaporation sources of a resistance-heating type, and the first layer 111 in which NPB and molybdenum oxide are mixed is formed by co-evaporation while drawing a vacuum. In this case, NPB is evaporated at a deposition rate of 0.4 nm/s, and molybdenum oxide is evaporated so that the weight ratio of molybdenum oxide to NPB is ¼. The film thickness of the first layer 111 is made 120 nm.

Next, the second layer 112 is formed on the first layer 111. In the present embodiment, the second layer 112 in which $Alq_3$ and molybdenum oxide are mixed is formed by co-evaporating $Alq_3$ and molybdenum oxide (VI). In this case, $Alq_3$ is evaporated at a deposition rate of 0.4 nm/s, and molybdenum oxide is evaporated so that the weight ratio of molybdenum oxide to $Alq_3$ is ¼. The film thickness of the second layer 112 is made 30 nm.

Further, the third layer 113 is formed on the second layer 112. In the present embodiment, the third layer 113 in which $Alq_3$ and lithium oxide are mixed is formed by co-evaporating $Alq_3$ and lithium oxide. In this case, $Alq_3$ is evaporated at a deposition rate of 0.4 nm/s, and lithium oxide is evaporated so that the weight ratio of lithium oxide to $Alq_3$ is 7/100. The film thickness of the third layer 113 is made 10 nm.

Finally, as the second electrode 102, Al is deposited to be 150 nm, and a CEL element according to the present invention is thus obtained.

Embodiment 4

In Embodiment 4, a specific structure of the CEL element according to the present invention, which is disclosed in Embodiment Mode 2, will be exemplified. It is to be noted that the reference numerals in FIG. 5 are cited in Embodiment 4.

First, a glass substrate on which an ITSO 110 nm in film thickness is deposited is prepared. The deposited ITSO functions as the first electrode 101 in the present embodiment.

Next, the glass substrate with the first electrode 101 formed is fixed in a substrate holder in a vacuum deposition system so that the side with the first electrode 101 formed is made down. Then, NPB and molybdenum oxide (VI) are respectively put different evaporation sources of a resistance-heating type, and the first layer 111 in which NPB and molybdenum oxide are mixed is formed by co-evaporation while drawing a vacuum. In this case, NPB is evaporated at a deposition rate of 0.4 nm/s, and molybdenum oxide is evaporated so that the weight ratio of molybdenum oxide to NPB is ¼. The film thickness of the first layer 111 is made 120 nm.

Next, the second layer 112 is formed on the first layer 111. In the present embodiment, the second layer 112 in which $Alq_3$ and magnesium fluoride (VI) are mixed is formed by co-evaporating $Alq_3$ and magnesium fluoride. In this case, $Alq_3$ is evaporated at a deposition rate of 0.4 nm/s, and molybdenum oxide is evaporated so that the weight ratio of magnesium fluoride to $Alq_3$ is 9/100. The film thickness of the second layer 112 is made 30 nm.

Further, the third layer 113 is formed on the second layer 112. In the present embodiment, the third layer 113 in which $Alq_3$ and lithium oxide are mixed is formed by co-evaporating $Alq_3$ and lithium oxide. In this case, $Alq_3$ is evaporated at a deposition rate of 0.4 nm/s, and lithium oxide is evaporated so that the weight ratio of lithium oxide to $Alq_3$ is 7/100. The film thickness of the third layer 113 is made 10 nm.

Further, the fourth layer 114 is formed on the third layer 113. In the present embodiment, in the same way as the first layer 111, the fourth layer 114 in which NPB and molybdenum oxide are mixed is formed by co-evaporating NPB and molybdenum oxide. In this case, NPB is evaporated at a deposition rate of 0.4 nm/s, and molybdenum oxide is evaporated so that the weight ratio of molybdenum oxide to NPB is ¼. The film thickness of the fourth layer 114 is made 120 nm.

Finally, as the second electrode 102, Al is deposited to be 150 nm, and a CEL element according to the present invention is thus obtained.

Although the present invention has been fully described by way of example with reference to the accompanying drawings, it is to be understood that various changes and modifications will be apparent to those skilled in the art. Therefore, unless such changes and modifications depart from the scope of the present invention hereinafter defined, they should be construed as being included therein.

This application is based on Japanese Patent Application serial No. 2004-290678 filed in Japan Patent Office on Oct. 1, 2004, the entire contents of which are hereby incorporated by reference.

EXPLANATION OF REFERENCE

100: substrate, 101: first electrode, 102: second electrode, 103: composite layer, 111: first layer, 112: second layer, 113: third layer, 114: fourth layer, 201: first electrode (anode), 202: second electrode (cathode), 203: composite layer, 211: hole transporting layer, 212: light-emitting layer, 213: electron transporting layer, 801: source-side driver circuit, 802: pixel portion, 803: gate-side driver circuit, 804: sealing substrate, 805: sealing material, 806: region, 807: connecting wiring, 808: FPC (flexible printed circuit), 810: substrate, 811: switching TFT, 812: current controlling TFT, 813: first electrode, 814: insulator, 815: composite layer, 816: second layer, 817: CEL element, 823: n-channel TFT, 824: p-channel TFT, 9101: frame body, 9102: support, 9103: display portion, 9104: speaker portion, 9105: video input terminal, 9201: main body, 9202: frame body, 9203: display portion, 9204: keyboard, 9205: external connection port, 9206: pointing mouse, 9301: main body, 9302: display portion, 9303: switch, 9304: operation keys, 9305: infrared port, 9401: main body, 9402: frame body, 9403: display portion A, 9404: display portion, 9405: recording medium reading portion, 9406: operation key, 9407: speaker portion, 9501: main body, 9502: display portion, 9503: arm portion, 9601: main body, 9602: display portion, 9603: frame body, 9604: external connection port, 9605: remote-control receiving portion, 9606: image receiving portion, 9607: battery, 9608: sound input portion, 9609: operation keys, 9610: eye piece, 9701: main body, 9702: frame body, 9703: display portion, 9704: sound input portion, 9705: sound output portion, 9706: operation key, 9707: external connection port, 9708 antenna

The invention claimed is:

1. A light-emitting element comprising:
at least a first electrode and a second electrode;
a first layer between the first electrode and the second electrode, said first layer including a first organic compound and a first inorganic compound that exhibits an electron accepting property to the first organic compound;
a second layer between the first layer and the second electrode, said second layer including a second organic compound that is luminescent and a second inorganic compound; and
a third layer between a second layer and the second electrode, said third layer including a third organic compound and a third inorganic compound that exhibits an electron donating property to the third organic compound.

2. The light-emitting element according to claim 1, wherein the first organic compound is a hole transporting organic compound.

3. The light-emitting element according to claim 1, wherein the first organic compound is an organic compound having an aromatic amine skeleton.

4. The light-emitting element according to claim 1, wherein the third organic compound is an electron transporting organic compound.

5. The light-emitting element according to claim 1, wherein the third organic compound is one of a chelate metal complex having a chelate ligand including an aromatic ring, an organic compound having a phenanthroline skeleton, and an organic compound having an oxadiazole skeleton.

6. The light-emitting element according to claim 1, wherein the first inorganic compound is a metal oxide.

7. The light-emitting element according to claim 6, wherein the metal oxide is a transition metal oxide having a transition metal that belongs to any one of Groups 4 to 12 of the periodic table.

8. The light-emitting element according to claim 6, wherein the metal oxide is a metal oxide selected from the group consisting of vanadium oxide, molybdenum oxide, tungsten oxide, and rhenium oxide.

9. The light-emitting element according to claim 1, wherein the first inorganic compound is a metal nitride.

10. The light-emitting element according to claim 1, wherein the second inorganic compound is a metal oxide.

11. The light-emitting element according to claim 10, wherein the metal oxide is a metal oxide having a metal that belongs to any one of Groups 13 or 14 of the periodic table.

12. The light-emitting element according to claim 10, wherein the metal oxide is a metal oxide selected from the group consisting of aluminum oxide, gallium oxide, silicon oxide, and germanium oxide.

13. The light-emitting element according to claim 1, wherein the second inorganic compound is a metal nitride.

14. The light-emitting element according to claim 1, wherein the third inorganic compound is a metal oxide.

15. The light-emitting element according to claim 14, wherein the metal oxide is one of an alkali metal oxide, an alkali-earth metal oxide, and a rare-earth metal oxide.

16. The light-emitting element according to claim 14, wherein the metal oxide is one of lithium oxide and barium oxide.

17. The light-emitting element according to claim 1, wherein the third inorganic compound is a metal nitride.

18. The light-emitting element according to claim 17, wherein the metal nitride is one of an alkali metal nitride, an alkali-earth metal nitride, and a rare-earth metal nitride.

19. The light-emitting element according to claim 17, wherein the metal nitride is a metal nitride selected from the group consisting of lithium nitride, magnesium nitride, and calcium nitride.

20. A light-emitting element comprising:
at least a first electrode and a second electrode;
a first layer between the first electrode and the second electrode, said first layer including a first organic compound and a first inorganic compound that exhibits an electron accepting property to the first organic compound;
a second layer between the first layer and the second electrode, said second layer including a second organic compound that is luminescent and a second inorganic compound;
a third layer between the second layer and the second electrode, said third layer including a third organic compound and a third inorganic compound that exhibits an electron donating property to the third organic compound; and
a fourth layer between the third layer and the second electrode, said fourth layer including a fourth organic compound and a fourth inorganic compound that exhibits an electron accepting property to the fourth organic compound.

21. The light-emitting element according to claim 20, wherein at least one of the first organic compound and the fourth organic compound is a hole transporting organic compound.

22. The light-emitting element according to claim 20, wherein at least one of the first organic compound and the fourth organic compound is an organic compound having an aromatic amine skeleton.

23. The light-emitting element according to claim 20, wherein the third organic compound is an electron transporting organic compound.

24. The light-emitting element according to claim 20, wherein the third organic compound is one of a chelate metal complex having a chelate ligand including an aromatic ring, an organic compound having a phenanthroline skeleton, and an organic compound having an oxadiazole skeleton.

25. The light-emitting element according to claim 20, wherein at least one of the first inorganic compound and the fourth inorganic compound is a metal oxide.

26. The light-emitting element according to claim 25, wherein the metal oxide is a transition metal oxide having a transition metal that belongs to any one of Groups 4 to 12 of the periodic table.

27. The light-emitting element according to claim 25, wherein the metal oxide is a metal oxide selected from the group consisting of vanadium oxide, molybdenum oxide, tungsten oxide, and rhenium oxide.

28. The light-emitting element according to claim 20, wherein at least one of the first inorganic compound and the fourth inorganic compound is a metal nitride.

29. The light-emitting element according to claim 20, wherein the second inorganic compound is a metal oxide.

30. The light-emitting element according to claim 29, wherein the metal oxide is a metal oxide having a metal that belongs to any one of Groups 13 or 14 of the periodic table.

31. The light-emitting element according to claim 29, wherein the metal oxide is a metal oxide selected from the group consisting of aluminum oxide, gallium oxide, silicon oxide, and germanium oxide.

32. The light-emitting element according to claim 20, wherein the second inorganic compound is a metal nitride.

33. The light-emitting element according to Glaims claim 20, wherein the third inorganic compound is a metal oxide.

34. The light-emitting element according to claim 33, wherein the metal oxide is one of an alkali metal oxide, an alkali-earth metal oxide, and a rare-earth metal oxide.

35. The light-emitting element according to claim 33, wherein the metal oxide is one of lithium oxide and barium oxide.

36. The light-emitting element according to claim 20, wherein the third inorganic compound is a metal nitride.

37. The light-emitting element according to claim 36, wherein the metal nitride is one of an alkali metal nitride, an alkali-earth metal nitride, and a rare-earth metal nitride.

38. The light-emitting element according to claim 36, wherein the metal nitride is a metal nitride selected from the group consisting of lithium nitride, magnesium nitride, and calcium nitride.

39. The light-emitting element according to claim 1, wherein the light emitting element is incorporated in an electronic appliance selected from the group consisting of a video camera, a digital camera, a goggle-type display, head mount display, a navigation system, a sound reproduction device, an in-car audio system, an audio component, a personal computer, a game machine, a personal digital assistant, a mobile computer, a cellular phone, a portable game machine, an electronic book, and an image reproduction device equipped with a recording medium.

40. The light-emitting element according to claim 20 wherein the light emitting element is incorporated in an electronic appliance selected from the group consisting of a video camera, a digital camera, a goggle-type display, head mount display, a navigation system, a sound reproduction device, an in-car audio system, an audio component, a personal computer, a game machine, a personal digital assistant, a mobile computer, a cellular phone, a portable game machine, an electronic book, and an image reproduction device equipped with a recording medium.

* * * * *